(12) United States Patent
Hanel et al.

(10) Patent No.: US 12,664,329 B2
(45) Date of Patent: Jun. 23, 2026

(54) PARALLELIZED VEHICLE IMPACT ANALYSIS

(71) Applicant: DASSAULT SYSTEMES DEUTSCHLAND GMBH, Stuttgart (DE)

(72) Inventors: Michael Hanel, Hannover (DE); Hannes Thielhelm, Hannover (DE)

(73) Assignee: DASSAULT SYSTEMES DEUTSCHLAND GMBH, Stuttgart (DE)

( * ) Notice: Subject to any disclaimer, the term of this patent is extended or adjusted under 35 U.S.C. 154(b) by 139 days.

(21) Appl. No.: 17/366,540

(22) Filed: Jul. 2, 2021

(65) Prior Publication Data

US 2022/0004674 A1     Jan. 6, 2022

(30) Foreign Application Priority Data

Jul. 3, 2020    (EP) ..................................... 20184097

(51) Int. Cl.
| | |
|---|---|
| *G06F 30/15* | (2020.01) |
| *G06T 17/10* | (2006.01) |
| *G06T 17/20* | (2006.01) |

(52) U.S. Cl.
CPC .............. *G06F 30/15* (2020.01); *G06T 17/10* (2013.01); *G06T 17/20* (2013.01)

(58) Field of Classification Search
CPC ...... G06F 30/15; G06F 2111/10; G06F 17/13; G06T 17/10; G06T 17/20; G06T 11/203; G06T 7/62; G06T 7/66; G06T 2210/21
See application file for complete search history.

(56) References Cited

U.S. PATENT DOCUMENTS

| | | | | |
|---|---|---|---|---|
| 2006/0288080 A1* | 12/2006 | Orszag | ................... | H04L 67/06 |
| | | | | 709/217 |
| 2007/0143087 A1* | 6/2007 | Musale | ............. | G01M 17/0078 |
| | | | | 703/8 |

(Continued)

FOREIGN PATENT DOCUMENTS

| | | |
|---|---|---|
| CN | 103136790 A | 6/2013 |
| JP | 2013-058173 A | 3/2013 |

(Continued)

OTHER PUBLICATIONS

Inui, Masatomo, Nobuyuki Umezu, and Yuuki Kitamura. "Visualizing sphere-contacting areas on automobile parts for ECE inspection." Journal of Computational Design and Engineering 2.1 (2015): 55-66. (Year: 2015).*

(Continued)

*Primary Examiner* — Renee D Chavez
*Assistant Examiner* — Pursottam Giri
(74) *Attorney, Agent, or Firm* — Oblon, McClelland, Maier & Neustadt, L.L.P.

(57) ABSTRACT

A computer-implemented method for vehicle impact analysis including obtaining a B-Rep representing an outer surface of a vehicle, the B-Rep having faces and obtaining a radius value for a contact sphere. The method also includes determining one or more two-point-contact curves of the B-Rep for the radius value. The determining includes, for each respective pair of portions of a plurality of pairs of portions of the B-Rep, applying a respective two-point-contact-curve computing algorithm. The computing algorithm is based on the respective pair of portions. The computing algorithm is parallelized over the plurality of pairs of portions. The method forms an improved solution for vehicle impact analysis.

19 Claims, 19 Drawing Sheets

(56) References Cited

U.S. PATENT DOCUMENTS

| | | | |
|---|---|---|---|
| 2011/0295576 A1 | 12/2011 | Miyata et al. | |
| 2012/0280983 A1* | 11/2012 | Letzelter | G06F 30/00 345/419 |
| 2014/0184599 A1* | 7/2014 | Quilot | G06T 17/10 345/423 |
| 2015/0269286 A1* | 9/2015 | Rameau | G06F 30/00 703/1 |
| 2017/0220730 A1* | 8/2017 | Marini | G06T 17/00 |
| 2018/0351692 A1* | 12/2018 | Rozenboim | H04L 47/6255 |
| 2020/0210636 A1 | 7/2020 | Sanchez Bermudez et al. | |
| 2022/0075914 A1 | 3/2022 | Macklin et al. | |

FOREIGN PATENT DOCUMENTS

| | | |
|---|---|---|
| JP | 2017-111636 A | 6/2017 |
| JP | 2020-027654 A | 2/2020 |

OTHER PUBLICATIONS

Thielhelm, H., "Numerische Modellierung und Lösung von geodätischen Randwertproblemen," Dissertation, Gottfried Wilhelm Leibniz Universität Hannover, 2017, 152 total pages (with English abstract).

Hanel, M. R., "Untersuchung und Implementation verschiedener Kollisionserkennungsalgorithmen für deformierbare Körper," Masterarbeit, Leibniz Universität Hannover, 2007, 103 total pages (with English abstract).

Posselt, J. "Erweiterung der Sicherheitsradien-Diagnose von Gitterbauteilen in ICEM Surf," Bachelorarbeit, Fachhochschule Bielefeld, 2019-2020, 70 total pages (with English abstract).

U.S. Office Action issued Jul. 7, 2023, in U.S. Appl. No. 17/367,285, 45 pages.

"Another", Oxford English Dictionary [retrieved on Jul. 1, 2023]. Retrieved from «https://www.oed.com/view/Entry/8102?rskey=oFSZHJ&result=2» (Year: 2023).

"Other", Oxford English Dictionary [retrieved on Jul. 1, 2023]. Retrieved from «https://www.oed.com/view/Entry/133219?rskey=B6hepm&result=1» (Year: 2023).

Farouki et al., "Approximation of rolling-ball blends for free-form parametric surfaces" Computer-Aided Design, vol. 26. No 11,pp. 671-676 [retrieved on Jun. 14, 2023] (Year: 1996).

Inui et al., "Visualizing sphere-contacting areas on automobile parts for ECE inspection" Journal of Computational Design and Engineering, vol. 2, (2015), pp. 55-66. (Year: 2015).

Forsyth, M., "Shelling and Offsetting Bodies" Proceedings of the third ACM symposium on Solid modeling and applications. 1995. [ retrieved on Jun. 12, 2023] (Year: 1995).

Koparkar, P., "Surface intersection by switching from recursive subdivision to iterative refinement" The Visual Computer (1991), vol. 8, pp. 47-63 [retrieved on Jun. 13, 2023] (Year: 1991).

"Regulation No. 26 of the Economic Commission for Europe of the United Nations (UNIECE)—Uniform Provisions Concerning the Approval of Vehicles with Regards to their External Projections" Office Journal of the European Union, XP055752256, Jun. 11, 2007, 19 pages. (Year: 2007).

Japanese Notice of Reasons for Refusal issued Feb. 25, 2025, in Japanese Patent Application No. 2021-109609 with English translation, 10 pgs.

Japanese Notice of Reasons for Refusal issued Feb. 25, 2025, in Japanese Patent Application No. 2021-109606 with English translation, 6 pgs.

Extended European Search Report issued Dec. 22, 2020, in corresponding European Patent Application No. 20184096.4, 13 pages.

European Office Action issued Feb. 3, 2025, in corresponding European Patent Application No. 20 184 097.2, 16 pages.

Satoru Yamazaki et al., "Fast safety verification of interior parts of automobiles", Mechatronics and Automation (ICMA), 2011 International Conference On, IEEE, Aug. 7, 2011, pp. 1957-1962, XP032019920.

Anonymous: "About Creating Solid Spheres: AutoCAD: Autodesk Knowledge Network", Jul. 8, 2014, XP055752276, Retrieved from the Internet: URL:https://knowledge.autodesk.com/support/autocad/learnexplore/caas/CloudHelp/cloudhelp/2015/ENU/AutoCAD-Core/files/GUID-90AF19E7-6AA4-4D34-B435-1094210BA74C-htm.html [retrieved on Nov. 19, 2020].

Hannes Thielhelm et al., "Geodesic bifurcation on smooth surfaces", in the Visual Computer 31, 2014, pp. 1-18.

"Newton's method", Retrieved from the Internet: https://en.wikiepdia.org/wiki/Newton%27s_method, 2021, 12 pages.

"Runge-Kutta method", Retrieved from the Internet: https://en.wikipedia.org/Runge%E2%80%93Kutta_methods, 2021, 9 pages.

Combined Chinese Office Action and Search Report issued Dec. 20, 2025, in corresponding Chinese Patent Application No. 202110748072.4 (with English Translation), 24 pages.

Sébastien Crozet, "Efficient contact determination between solids with boundary representations (B-Rep)", Sep. 20, 2018, HAL open science, https://hai.science/tei-01844077x2. 159 pages.

Patrikalakis, Nicolas M. et al., "Shape Interrogation for Computer Aided Design and Manufacturing", Springer-Verlag Berlin Heidelberg 2002. (418 pages).

Ericson, Christer et al., "Real-Time Collision Detection", 2005 by Elsevier Inc. (632 pages).

Office Action dated Mar. 3, 2026, issued in counterpart CN Application No. 202110748575.1, with English translation, citing documents No. 1-3. (21 pages).

Sacchi, R. "Primitive-based segmentation for triangulated surfaces" [Thesis] Nottingham Trent University [retrieved on Mar. 9, 2026] ( Year: 2001) (230 pages).

Final Rejection dated Apr. 1, 2026, issued in counterpart U.S. Appl. No. 18/658,500, citing documents No. 1-3. (26 pages).

* cited by examiner

114

112

| Example | Number of Vertices | Number of Faces | Duration with 1 Thread [sec] | Duration with 8 Thread [sec] | Speedup |
|---------|---------|---------|---------|---------|---------|
| 1 | 545868 | 972532 | 451.52 | 255.76 | 1.77 |
| 2 | 308858 | 546728 | 158.40 | 49.86 | 3.18 |
| 3 | 585640 | 1007554 | 509.60 | 288.70 | 1.77 |
| 4 | 365024 | 645205 | 228.64 | 102.80 | 2.22 |
| 5 | 340050 | 429049 | 574.67 | 178.62 | 3.22 |
| 6 | 70630 | 112558 | 61.41 | 30.07 | 2.04 |
| 7 | 46832 | 78813 | 60.07 | 34.02 | 1.76 |
| 8 | 24846 | 39628 | 9.45 | 4.72 | 2.00 |
| 9 | 3023 | 4802 | 1.75 | 0.83 | 2.11 |

| Example | 1 | | | | 6 | | | | 8 | | | |
|---------|---|---|---|---|---|---|---|---|---|---|---|---|
| | T | H | B | C | T | H | B | C | T | H | B | C |
| Execution | 78% | 36% | 58% | 67% | 76% | 65% | 71% | 70% | 61% | 31% | 75% | 67% |
| Synchronization | 12% | 63% | 38% | 29% | 18% | 32% | 24% | 26% | 28% | 68% | 15% | 26% |
| I/O | 0% | 0% | 0% | 0% | 0% | 0% | 1% | 0% | 4% | 0% | 6% | 0% |
| Sleep | 0% | 0% | 0% | 0% | 0% | 0% | 0% | 0% | 0% | 0% | 0% | 0% |
| Memory | 1% | 0% | 0% | 0% | 0% | 0% | 0% | 0% | 0% | 0% | 0% | 0% |
| Preemption | 9% | 1% | 4% | 4% | 4% | 3% | 4% | 4% | 7% | 1% | 4% | 7% |
| UI | 0% | 0% | 0% | 0% | 0% | 0% | 0% | 0% | 0% | 0% | 0% | 0% |

PARALLELIZED VEHICLE IMPACT ANALYSIS

CROSS-REFERENCE TO RELATED APPLICATIONS

This application claims priority under 35 U.S.C. § 119 or 365 to European Application No. 20184097.2, filed Jul. 3, 2020. The entire contents of the above application(s) are incorporated herein by reference.

FIELD

The disclosure relates to the field of computer programs and systems, and more specifically to a method, system and program for vehicle impact analysis.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

CAD solutions may be used for vehicle impact analysis, notably in order to analyze impacts of human parts (such as a head or knee) susceptible to occur on an (interior or exterior) outer surface of a vehicle, based on a CAD model of the vehicle representing the outer surface. A software solution provided by Dassault Systèmes notably offers such functionality (under the trademark ICEM Surf).

Vehicle impact analysis may comprise a vehicle impact diagnosis, which may essentially be a head impact diagnosis (also referred to as "HID" in the following, the same acronym being also used when considering impact with other human parts than the head such as the knee, for the sake of convenience). Such diagnosis falls within the scope of safety analysis for cars, or other passenger and commercial vehicles. In this context, automotive companies have to comply with certain specifications and/or provisions. Examples of such provisions are set in the EU and the US by the following regulations:

ECE-R 26 passenger vehicles (EU, exterior);
ECE-R 61 commercial vehicles (EU, exterior);
FMVSS 208 frontal impact (US, exterior);
ECE-R21 cockpit structure (EU, interior);
FMVSS 201 dashboard (US, interior).

These specifications have to be checked thoroughly within the design process of each new vehicle and are subject to a control process by the respective authorities, before the vehicle is approved for serial production. The specifications especially focus on a static geometrical analysis of the interior and exterior of the vehicle where human body parts (as for example the head or a knee) are modeled as a sphere with an appropriate size. The analysis then considers geometric situations which are described as contact spheres attached to the exterior/interior of the vehicle. The contact spheres model the impact of the head/knee of a pedestrian or passenger on the vehicle. These situations are of particular importance as they represent the precise points in time where forces applied to the human body can be estimated based on the number of contact points, their distance with respect to each other, and the curvature of the vehicle's outer surface at the contact points.

Thus, software solutions have been developed to provide computer-implemented methods for vehicle impact analysis, where the method comprises providing a CAD model representing an outer surface of a vehicle, providing a radius value for a contact sphere, and determining one or more contact geometries of the CAD model for the radius value.

Specific existing solutions notably allow determining automatically one-point-contact vertices and non-contact vertices of a mesh representing an outer surface of a vehicle. These specific existing solutions offer a global HID, which solely works on the tessellation of an input geometry. Other specific existing solutions allow determining two-point-contact locations of a mesh representing an outer surface of a vehicle. These other specific existing solutions are however inaccurate and non-ergonomic, as they notably rely on extensive manual pre-processing and post-processing.

Within this context, there is still a need for improved solutions for vehicle impact analysis.

SUMMARY

It is therefore provided a computer-implemented method for vehicle impact analysis. The method comprises providing a B-Rep representing an outer surface of a vehicle, the B-Rep has faces. The method comprises providing a radius value for a contact sphere. The method also comprises determining one or more two-point-contact curves of the B-Rep for the radius value. The determining includes, for each respective pair of portions of a plurality of pairs of portions of the B-Rep, a respective two-point-contact-curve computing algorithm. The computing algorithm is based on the respective pair of portions. The computing algorithm is parallelized over the plurality of pairs of portions.

The method may comprise one or more of the following:
  each portion of each pair of portions among the plurality of pairs of portions is a respective face of the B-Rep;
  the determining includes tessellating the B-Rep and processing the tessellation, the processing including:
    identifying, for the radius value, one-point-contact vertices and non-contact vertices;
    defining transition edges, each transition edge being bounded by a respective one-point-contact vertex and a respective non-contact vertex; and
  the computing algorithm taking as input, for each respective pair of portions, a respective set of transition edges of the respective pair of portions;

the tessellating is parallelized over the set of portions, the processing and the computing algorithm being performed after the tessellating has ended;

the processing is parallelized over the set of portions, the computing algorithm being performed after the processing has ended;

for each respective pair of portions, the computing algorithm includes, iteratively and until the respective set of transition edges is empty:

selecting a transition edge from the respective set of transition edges;

attempting to trace of a two-point-contact curve based on the selected transition edge;

if the tracing attempt is successful, deleting, from the respective set of transition edges, all transition edges intersecting the traced two-point-contact curve; and deleting, from the respective set of transition edges, the selected transition edge;

each face of the B-Rep is supported by a respective surface parameterization, the tracing including integrating a respective differential equation, the differential equation being based on the pair of surface parameterizations of the respective pair of portions;

the determining (S30) comprises:

attempting to establish one or more pairs of candidate starting points, each candidate starting point belonging to a respective portion of the respective pair of portions, each pair of candidate starting points being attempted to be established based on a respective transition edge of the respective pair of portions; and if the establishing attempt is successful, in the computing algorithm:

the selected transition edge is a respective transition edge based on which the determining (S30) is successful in establishing a respective pair of candidate starting points; and the tracing attempt comprises:

attempting to find a respective initial point belonging to the two-point-contact curve from the respective pair of candidate starting points; and if the finding attempt is successful, tracing the two-point-contact curve from the respective initial point the establishing attempt includes bisecting each respective transition edge of the respective pair of portions; and/or the establishing attempt is parallelized over the plurality of pairs of portions or over the set of portions.

It is further provided a computer program comprising instructions which, when executed by a processor, cause the processor to perform the method.

It is further provided a computer readable storage medium having recorded thereon the computer program.

It is further provided a system comprising a processor coupled to a memory, the memory having recorded thereon the computer program.

BRIEF DESCRIPTION OF THE DRAWINGS

Embodiments will now be described, by way of non-limiting example, and in reference to the accompanying drawings, where.

4

FIGS. 9, 10, 11, 12, 13, 14, 15, 16, 17, 18, 19, 20, 21, 22, 23, 24, 25, 26, 27, 28, 29, 30, 31, 32A-32B, 33, 34, 35, 36, 37, 38, 39, 40, 41, 42, 43, 44, 45, 46, 47, 48, 49 and 50 illustrate implementations of the method, including screenshots of a tested prototype (which, as real screenshots, may be in color and/or may contain small characters).

DETAILED DESCRIPTION

Figure 1:
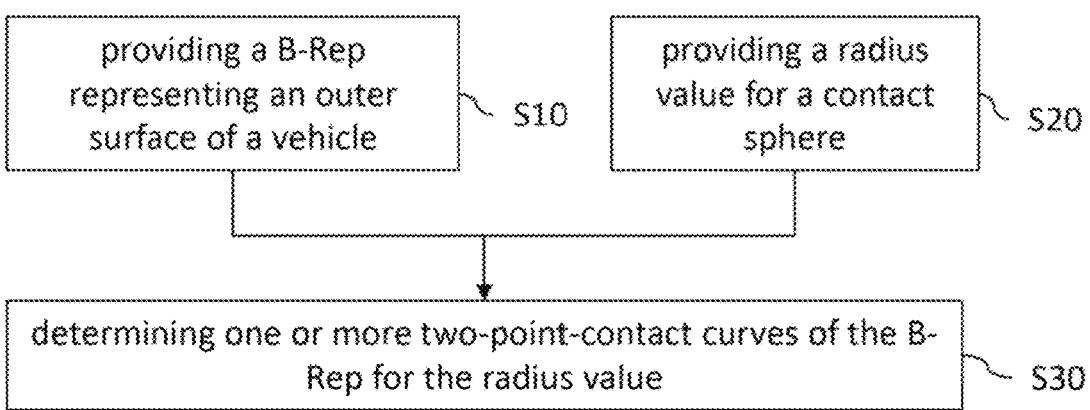
FIG. 1 shows a flowchart of an example of the method.

Referring to FIG. 1, it is provided a computer-implemented method for vehicle impact analysis. The method comprises providing S10 a B-Rep representing an outer surface of a vehicle. The B-Rep has faces. The method also comprises providing S20 a radius value for a contact sphere. The method then comprises determining S30 one or more two-point-contact curves of the B-Rep for the radius value. This already forms an improved solution for vehicle impact analysis.

Thanks to the determining at S30 of one or more two-point-contact curves for the radius value, the method allows an analysis of two-point-contact impacts on the vehicle. Multi-point-contact impacts are particularly important to analyze as these are geometrical models for points in time during a collision, where a major part of collision forces is unloaded on the considered parts of the human body.

Thanks to the fact that the method provides at S10 a CAD model of the outer surface of the vehicle which is a B-Rep in particular, the determined curves are curves of the B-Rep. As a result, the method outputs a relatively accurate geometrical representation of two-point-contact impacts. Indeed, the B-Rep is a continuous thus particularly precise representation of the outer surface of the vehicle, such that the output of the method is relatively accurate in that the curve is at least accurately positioned on said precise representation. The accuracy is notably improved relative to a mesh representation of the outer surface. Indeed, a mesh often stems from a tessellation of a more precise CAD model (which could even be a B-Rep), and in any case presents by construction an approximation/discretization error, that is, the tessellation precision.

According to a first aspect of the method, the determining S30 may include, for each respective two-point-contact curve (which is determined at S30), solving a respective differential equation. The respective differential equation is based on the B-Rep. This further improves the vehicle impact analysis.

Thanks to solving a differential equation for each two-point-contact curve, the method determines each two-point-contact curve in a well-defined manner, thus yielding an accurate result. In addition, thanks to the differential equation being based on the B-Rep, that is on a continuous thus particularly precise representation of the outer surface of the vehicle, the two-point-contact curves form a particularly accurate representation of two-point-contact impacts. Indeed, the solving is based on said precise representation, thus yielding a particularly accurate result.

The accuracy is notably improved compared to a solving which would be based on a mesh representation of the outer surface. This is particularly relevant for two-point impact analysis.

According to a second aspect of the method, the determining S30 may include, for each respective pair of portions of a plurality of pairs of portions of the B-Rep, a respective two-point-contact-curve computing algorithm based on the respective pair of portions. The computing algorithm is parallelized over the plurality of pairs of portions. This further improves the vehicle impact analysis.

Thanks to the parallelization of the computing algorithm, the method achieves computational efficiency. Thanks to the fact that the parallelization is conducted over a plurality of pairs of portions of the B-Rep in particular, the gain from parallel computing is particularly high, and parallel threads of the computing algorithm are particularly safe. Indeed, a two-point-contact impact occurs between a pair of portions of the outer surface of the vehicle. The method takes this into account to adequately parallelize the computations.

The first aspect and the second aspect of the method may be combined. In such a case, the determining S30 includes, according to the second aspect, for each respective pair of portions of a plurality of pairs of portions of the B-Rep, a respective two-point-contact-curve computing algorithm based on the respective pair of portions. And the determining further includes, according to the first aspect, for one or more respective two-point-contact curves determined within the parallelized threads of the computing algorithm (for example for each such respective two-point-contact curve), solving a respective differential equation based on the B-Rep.

Alternatively, the method may present the first aspect but not the second aspect. In such case, the computing algorithm may be unparallelized or parallelized over different threads. Yet alternatively, the method may present the second aspect but not the first aspect. In such a case, the two-point-contact-curve computing algorithm may exclude solving any differential equation based on the B-Rep, or even any differential equation at all.

The method is computer-implemented. This means that steps (or substantially all the steps) of the method are executed by at least one computer, or any system alike. A typical example of computer-implementation of a method is to perform the method with a system adapted for this purpose. The system may comprise a processor coupled to a memory, the memory having recorded thereon a computer program comprising instructions for performing the method. The memory may also store a database. The memory is any hardware adapted for such storage, possibly comprising several physical distinct parts (e.g. one for the program, and possibly one for the database). The system may further comprise a graphical user interface (GUI) coupled to the processor.

Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

In particular, the method may perform the providing S10 of the B-Rep and the providing S20 of the radius via user-interaction. Then, the method may perform the determining S30 fully automatically. In other words, the method may perform, fully automatically, the setting and/or solving of the differential equation according to the first aspect, and/or, the setting of parallel threads (including definition of the pairs of portions of the B-Rep) and/or the execution of the point-contact-curve computing algorithm (within each parallel thread, i.e., over each defined pair) according to the second aspect.

In examples, the method may comprise:

the providing S10 of the B-Rep via user-interaction;

triggering, by the user, a vehicle impact analysis functionality;

the providing S20 of the radius via user-interaction; and then the fully automatic determining S30.

The B-Rep is a 3D CAD modeled object, that is, a 3D modeled object having been designed or being designed with a CAD system. The method is thus part of a 3D CAD design process, which is itself part of a manufacturing process.

A modeled object is any object defined by data stored e.g. in the database. By extension, the expression "modeled object" designates the data itself. According to the type of the system, a modeled object may be defined by different kinds of data.

The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, faces or surfaces may be represented in various manners, e.g. non-uniform rational B-splines (NURBS).

Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a vehicle may typically be an assembly of thousands of parts.

In the context of CAD, a modeled object may typically be a 3D modeled object. By "3D modeled object", it is meant any object which is modeled by data allowing its 3D representation. A 3D representation allows the viewing of the object from all angles. For example, a 3D modeled object, when 3D represented, may be handled and turned around any of its axes, or around any axis in the screen on which the representation is displayed. This notably excludes 2D icons, which are not 3D modeled.

The 3D modeled object may represent the geometry of a vehicle to be manufactured in the real world subsequent to the completion of the vehicle impact analysis. The vehicle may be a passenger and/or commercial vehicle. The vehicle may be a terrestrial vehicle, such as a car, a truck, a motorcycle, a bus, or a train.

The vehicle may be an aerial vehicle, such as an airplane, a helicopter, or an airspace vehicle. The vehicle may be a naval vehicle, such as a commercial ship, an offshore equipment, a yacht, or a workboat.

Figure 2:
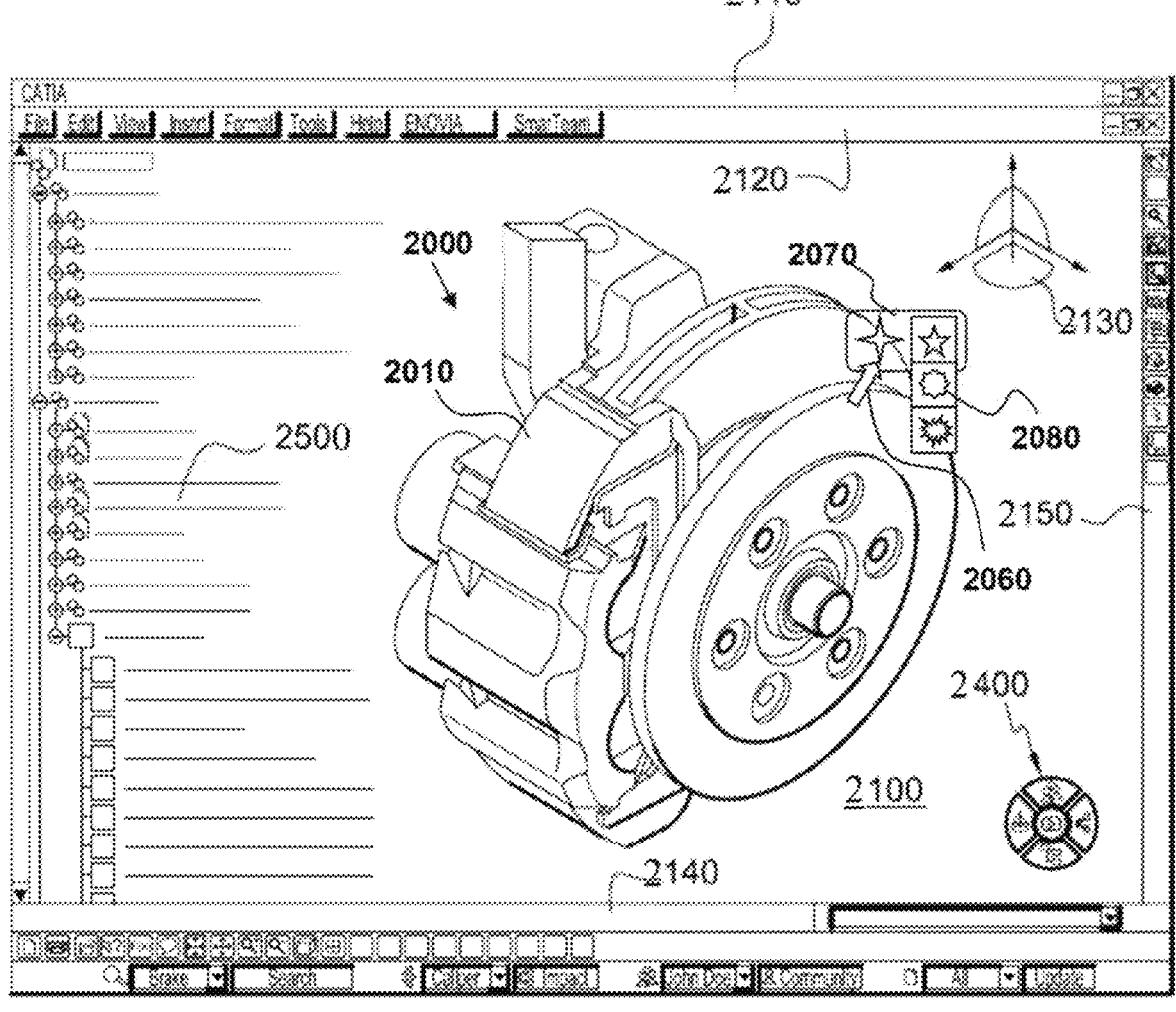
FIG. 2 shows an example of a graphical user interface of the system.

FIG. 2 shows an example of the GUI of the system, wherein the system is a CAD system. In the figure, the 3D modeled object is a brake assembly rather than an outer surface of a vehicle. However, the figure is merely to illustrate the CAD system and its functionalities.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
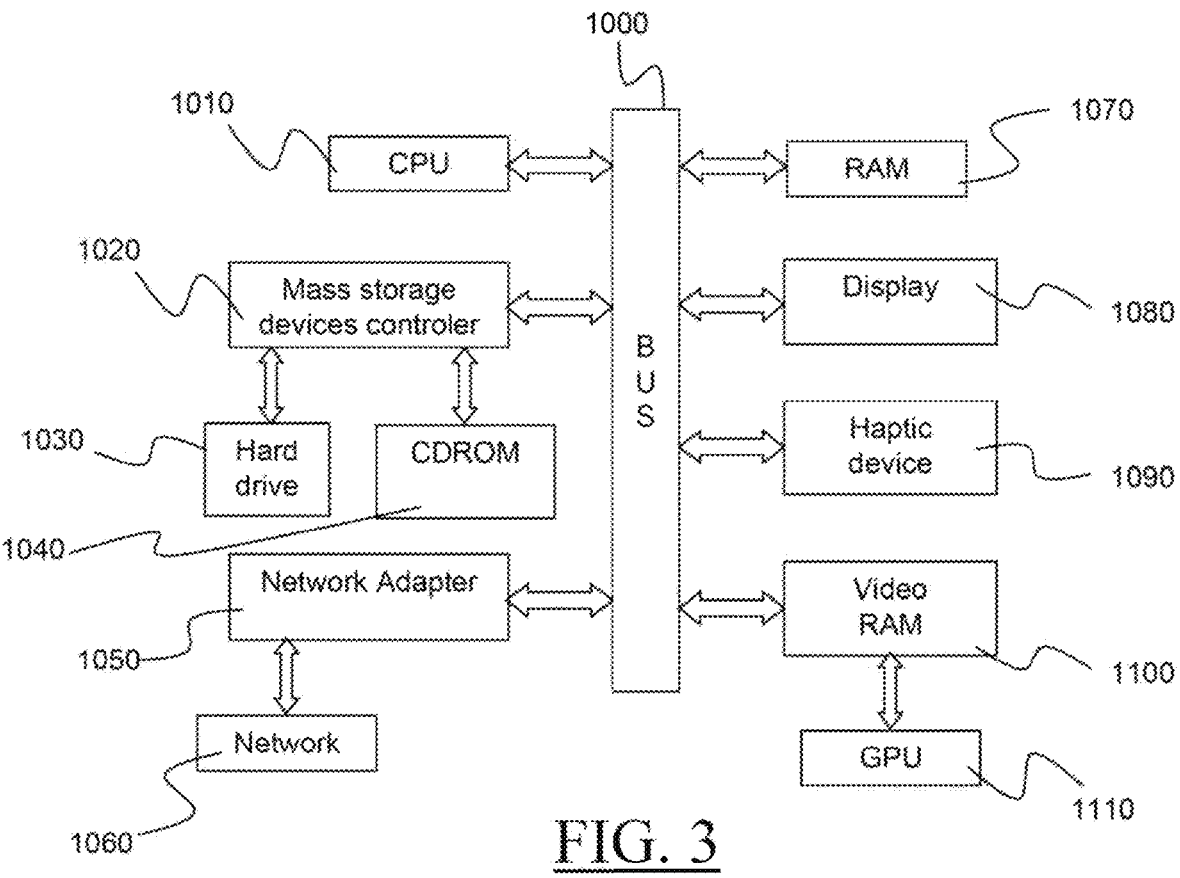
FIG. 3 shows an example of the system.

FIG. 3 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural, object-oriented programming language, or functional programming, or in assembly or machine language if desired. In any case, the language may be a compiled or interpreted language. The program may be a full installation program or an update program. Application of the program on the system results in any case in instructions for performing the method.

The method may be included in a manufacturing process, which may comprise, after performing the method, producing a physical vehicle corresponding to the B-Rep. Because the method improves the impact analysis of the vehicle, the method also improves the manufacturing process of the vehicle.

As known per se, vehicle impact analysis designates any analysis of impacts susceptible to occur on an outer surface of a vehicle, based on a CAD model of the vehicle. The CAD model is here the B-Rep provided at S10. By determining the one or more two-point-contact curves at S30, the method already allows such analysis. Indeed, the determining S30 outputs one or more data pieces (i.e., curves) each representing a respective succession of occurrences of a two-point-contact of the sphere on the B-Rep. These outputted data pieces can then be used in any vehicle impact analysis purpose.

A contact sphere is a sphere representation of an object susceptible to be impacted by an outer surface of the vehicle, such as a human part, for example the head or a knee. Sphere representations have long been used notably to represent heads and knees, as this captures well the shape and behavior variability among humans and yet allows relatively simple calculations. It is generally called a "contact" sphere because, in the vehicle impact analysis, potential contacts of the sphere with the outer surface are considered. The contact sphere may represent a human part which is unprotected or protected. For example, the contact sphere may represent a helmet worn by a human.

By "outer" surface of the vehicle, it meant any surface of the vehicle susceptible to be impacted by the contact sphere. The outer surface may be an outer surface of an exterior part of the vehicle (for example a body surface of the vehicle, or a class A surface of a car). In such a case, the vehicle may be a terrestrial vehicle (such as a car), and the vehicle impact analysis may be an analysis of impacts susceptible to occur for pedestrians. The outer surface may alternatively be an outer surface of an interior part of the vehicle. In such a case, the vehicle may be any passenger vehicle, and the vehicle impact analysis may be an analysis of impacts susceptible to occur for passengers.

The method may notably comprise displaying a graphical representation of the one or more two-point-contact curves, for example superposed on a graphical representation of the outer surface of the vehicle (e.g., a tessellation of the B-Rep). Such a visualization of the one or more two-point-contact curves allows vehicle impact analysis.

Alternatively or additionally, the method may comprise executing a visual inspection functionality. The visual inspection functionality may comprise displaying a sphere with the radius value provided at S20 and contacting the graphical representation of the outer surface. The method may then comprise moving the contact sphere (e.g., by a user or automatically), for example sliding the sphere along the graphical representation of the outer surface, for example by dragging the sphere, for example by a user and with a haptic device (such as a mouse). Such a sliding represents the occurrence of a vehicle-human impact. In particular, the user may slide the sphere along any two-point-contact curve determined at S30. Indeed, a human impacted by a vehicle may be considered to slide freely on one-point-contact areas, and then along two-point-contact curves when such a curve is met, until a three-point-contact point is met in turn. Thanks to the determining S30, the system may guide the user in such sliding, visually by displaying the curve, and/or by locking or semi-locking the sliding along the curve. During the visual inspection, the outer surface and the sphere are constantly displayed, such that the sliding of the sphere on the outer surface is displayed real-time (the user can see movement of the sphere).

Alternatively or additionally, the method may comprise analyzing the curvature of the surface at points of the outer surface depending on whether these point belong or not to a two-point-contact curve determined at S30.

Alternatively or additionally, the method may comprise executing an impact simulation based on the one or more two-point-contact curves determined at S30.

In all cases, the method may comprise assessing whether the vehicle meets safety standards, and/or improving safety of the vehicle by modifying its design, depending on the obtained results.

The providing S10 may comprise retrieving the B-Rep from a library of B-Reps previously designed. Alternatively, the providing S10 may comprise designing the B-Rep, from scratch or starting from a previous design.

"Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The method may comprise, after the determining S30, a design change of the B-Rep (by modifying its design), based on the determining S30 (for example to improve safety). The design change may be performed based directly on the one or more two-point-contact curves determined at S30, or based on any post-processing thereof which is part of the vehicle impact analysis. The design change may comprise smoothening the outer surface (i.e., reducing its curvature) at locations of one or more two-point-contact curves determined at S30.

The method may be iterated, wherein the providing S10, the providing S20, and the determining S30 are repeated.

At each iteration, the providing S10 may comprise retrieving the B-Rep provided at S10 of the previous iteration, and performing a design change. At one or more of the iterations, the design change may be performed based directly on the one or more two-point-contact curves determined at S30 of the previous iteration, or based on any post-processing thereof which is part of the vehicle impact analysis. This allows refining the B-Rep representation of the vehicle based on the vehicle impact analysis proposed by the method, thus converging toward an improved design.

Alternatively or additionally, at each iteration, the radius value provided at S20 may be the same as the previous iteration, or modified compared to the previous iteration. In the latter case, the B-Rep may be the same. This allows performing a refined impact analysis, thanks to considering different types of contact spheres. That being said, the method could well be iterated with both the radius and the B-Rep being modified from one iteration to another.

Although the boundary representation (also known as "B-Rep") format and its concepts used by the method are widely known, they are now discussed.

A B-Rep model includes topological entities and geometrical entities. Topological entities are: face, edge, and vertex. Geometrical entities are 3D objects: surface, plane, curve, line, point.

By definition, a face is a bounded portion of a surface, named the supporting surface. An edge is a bounded portion of a curve, named the supporting curve. A vertex is a point in 3D space. They are related to each other as follows. The bounded portion of a curve is defined by two points (the vertices) lying on the curve. The bounded portion of a surface is defined by its boundary, this boundary being a set of curve edges (i.e. portions of the supporting curves) lying on the surface. Edges of the face's boundary are connected together by sharing vertices. Faces are connected together by sharing edges. By definition, two faces are adjacent at an edge if they share said edge. Similarly, two edges are adjacent if they share a vertex.

Figure 4:
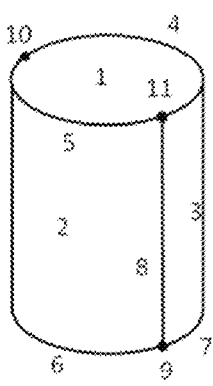
FIGS. 4, 5, 6, 7 and 8 illustrate the B-Rep format.
Figure 5:
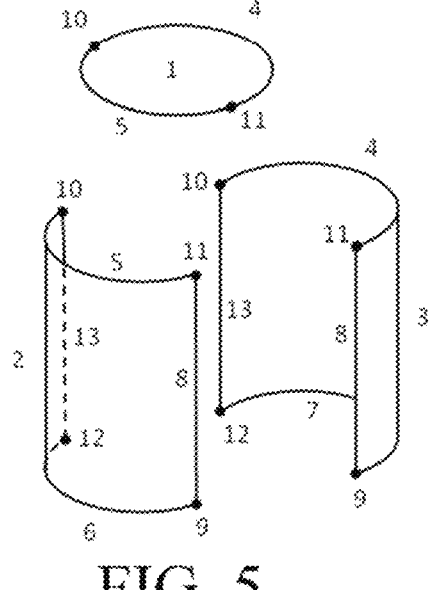

FIGS. 4-5 illustrate the B-Rep model of a cylindrical slot made of three faces: top planar face and two lateral cylindrical faces. FIG. 4 is the perspective view of the slot. Visible faces, edges and vertices are numbered. FIG. 5 is the exploded view of all faces. Duplicated numbers illustrate edges and vertices sharing. Face 1 is a bounded portion of a plane. Boundary of face 1 includes edges 4 and 5, each of them being bounded by vertices 10 and 11. These edges both have the same supporting circle. Face 2 is bounded by edges 6, 8, 5 and 13 all lying on an infinite cylindrical surface. Faces 1 and 2 are adjacent because they share edge 5. Faces 2 and 3 are adjacent because they share edges 8 and 13. Faces 1 and 3 are adjacent because they share edge 4.

Figure 6:
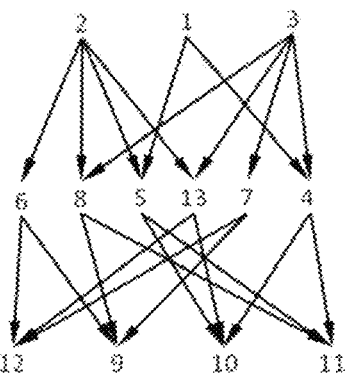

FIG. 6 illustrates the "is bounded by" topological relationship of the B-Rep model. Nodes of higher layer are faces, nodes of intermediate layer are edges and nodes of lower layer are vertices.

Figure 8:
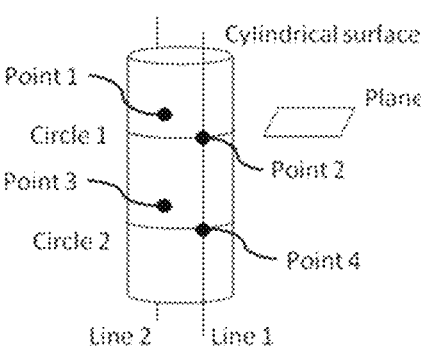
Figure 7:
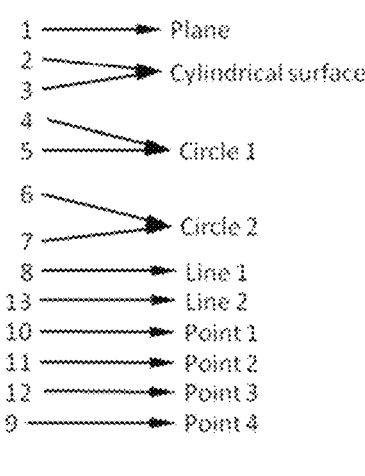

FIGS. 7-8 illustrates the relationship between topological entities (faces, edges, vertices) and the supporting geometries (infinite cylinder, infinite plane, infinite line, circle, points).

In the CAD system, the B-Rep model gathers in an appropriate data structure the "is bounded by" relationship, the relationship between topological entities and supporting geometries, and mathematical descriptions of supporting geometries.

In the following, the expressions "surface patch" or "patch" may be used in reference to either a face of the B-Rep or its supporting surface, and the expression "surface" itself may also either refer to the face or its supporting surface.

Given a radius value for a contact sphere (e.g. the value provided at S20), a k-point contact is a set of exactly k points (not more, not less) of the B-Rep where the contact sphere touches the outer surface, simultaneously and exactly at the k points of the set, without intersecting the outer surface in volume. In other words, the intersection between the contact sphere and the outer surface is exactly the set of k points, and the intersection between the contact sphere and the vehicle (i.e., the inside of the B-Rep as delimited by the outer surface) is of null/zero volume. The contact sphere may be called a "k-point-contact sphere" in reference to such a situation.

The determining S30 outputs one or more two-point-contact curves of the B-Rep for the radius value. Each two-point-contact curve is a curve lying on the B-Rep and representing a sequence of two-point contacts between the outer surface and a two-point contact sphere having the radius value. Each two-point-contact curve may be continuous.

Each two-point-contact curve may represent a (e.g. continuous) sequence of pairs of points where the two-point contact sphere having the radius value contacts the outer surface. In such a case, the B-Rep being defined in 3D, each two-point-contact curve may correspond to a function having output values in $\mathbb{R}^6$ (i.e., $\mathbb{R}^3 \times \mathbb{R}^3$). In other words, each two-point-contact curve is a pair of touching curves each having values in $\mathbb{R}^3$, and the two touching curves of the pair each represent the sequence of a respective one of the pair of contacts of the sphere. The two-point-contact curve representation determined at S30 allows grouping touching curves which correspond to a same two-point-contact sphere two-by-two by pairs. In other words, the determining S30 outputs information relative to said grouping, by outputting the one or more two-point-contact curves.

Based on said information, the method may comprise calculating a trajectory of the two-point-contact sphere corresponding to each respective two-point-contact curve. When each two-point-contact curve represents a sequence of pairs of points where the two-point contact sphere having the radius value contacts the outer surface, the method may further calculate the middle point of pairs of points of the sequence, and such a middle point describes the center of the two-point sphere. The curves of such middle points thus represents the trajectory of the center of the two-point sphere. Since the radius is the one provided at S30, the earlier-mention visual inspection functionality may thus be based on the output of the determining S30. The visual inspection functionality may in particular comprise displaying a sphere with the radius value provided at S20 and centered around the calculated middle points. By construction, such a sphere is displayed as contacting the graphical representation of the outer surface at the two-point-contact curves.

Each two-point-contact curve may be represented by a polygon. Each vertex of the polygon may be a pair of points each of $\mathbb{R}^3$. This allows an efficient representation of the two-point-contact curve and an efficient determination at S30. The middle points of the pairs of points form themselves a polygon, which represents the trajectory of the center of the two-point sphere.

The first aspect of the method is now discussed.

According to the first aspect, the determining S30 includes, for each respective two-point-contact curve, solving a respective differential equation based on the B-Rep. In such a case, each respective two-point-contact curve is determined at S30 in a portion of the B-Rep which is differentiable. In examples, the B-Rep may be differentiable everywhere. In any case, the method may comprise determining all two-point-contact curves of the differentiable part of the B-Rep, for the radius value. This allows an exhaustive vehicle impact analysis.

As already mentioned, each face of the B-Rep is supported by a respective surface parameterization. In such case, the respective differential equation solved at S30 may be based on a respective pair of surface parameterizations (i.e., those supporting the two-point contact). Thus, the determining S30 fully exploits the continuous and accurate geometrical representation conveyed by the B-Rep, thereby yielding an accurate result.

The respective pair of surface parameterizations corresponds to a pair of faces, which may be either different or the same face. With respect to the latter case, it is noted that a two-point contact may occur, for a sphere with the radius value, between two different portions of the B-Rep belonging to a single and same face of the B-Rep (for example if said face is bended enough).

The respective differential equation may be the following:

$$DF(u(t),v(t),a(t),b(t))*(u'(t),v'(t),a'(t),b'(t))=0$$

DF is a differential (e.g., Jacobian), with respect to a parameter t (i.e., a variable parameterizing the considered differential/Jacobian), of a system function $F: \mathbb{R}^4 \rightarrow \mathbb{R}^3$ provided by the following:

$$F(u,v,a,b)=s_1(u,v)+R\ N_1(u,v)-[s_2(a,b)+R\ N_2(a,b)]$$

$\{s_1, s_2\}$ is the respective pair of surface parameterizations (where $s_1$ may be equal to $s_2$ if the contact occurs within a single face). $N_1$ and $N_2$ are respective normal maps of $s_1$ and $s_2$ (thus normal maps of the face(s) parameterized by $s_1$ and $s_2$). (u,v) and (a,b) are respective parameter couples of $s_1$ and $s_2$. R is the radius value provided at S20. Finally, u'(t),v'(t), a'(t),b'(t) are respective derivatives of u, v, a,b with respect to t.

This system function describes the two-point contact of the sphere at pairs of points $\{s_1(u(t),v(t)),s_2(a(t),b(t))\}$ of the B-Rep, where each contact is substantially tangent to the B-Rep, such that a length equal to the radius value in the normal direction and from the pairs of points should yield the same position, that is, the position of the center of the sphere. Solving such a function system yields a particularly accurate result.

Now, the solving of the respective differential equation may include integrating the respective differential equation from an initial value. The integration allows a robust solving. The method may perform the integration according to any known method. The integration may be referred to as "tracing", since it traces the two-point-contact curve. An example of the tracing is referred to as T1 later.

For example, the method may perform a numeric integration. In particular, the integrating may comprise successive numeric integration steps each yielding a respective segment portion of the respective two-point-contact curve. This allows a robust integration. The method may notably implement a Runge-Kutta method.

The method may conduct the successive numeric integration steps until one of the two following conditions is evaluated to be fulfilled: (I) the contact sphere intersects with a rest of the B-Rep, (II) a face boundary is reached. This allows stopping the integration when appropriate.

In the case of condition (I), by "rest of the B-Rep" it is meant all other locations of the B-Rep apart from the two points of the B-Rep corresponding to the two-contact (i.e., $s_1(u(t),v(t))$ and $s_2(a(t),b(t))$ yielded by the integration, at each step). In other words, the integration stops when the contact sphere of radius value R, when it touches the B-rep at $s_1(u(t),v(t))$ and $s_2(a(t),b(t))$, is evaluated to also enter into collision with a third portion of the B-Rep. This corresponds to the occurrence of a three-point contact of the local sphere, or in other words, to the occurrence of a three-point-contact sphere. In such a case, the two-point contact is physically stopped by the presence of said third portion.

In the case of condition (II), the integration would not yield a result located on the face anymore if the numeric integration steps were continued. The stopping of the integration by condition (II) thus yields an extremity of the two-point-contact curve which is a two-point contact position. Either the boundary of the face is a boundary of the B-Rep (which is thus an open B-Rep), and in such a case the end of the integration corresponds to the end of the curve, or the boundary of the face is also the boundary of another face which is adjacent, and in such a case, the two-point-contact curve is truncated, but it may connect to another two-point-contact curve determined in a similar manner for said adjacent face.

The solving of the respective differential equation may for example include, at each current integration step: testing (I) intersection of the contact sphere with a rest of the B-Rep, and if the test is positive, stopping the integrating (condition (I)). The solving may further include testing (II) if a face boundary has been reached, and if the test is positive, stopping the integrating (condition (II)). Performing this second test (II) might be conditioned to the first test (I) having been negative (i.e. no need for the second test if the first test was positive).

In the case of condition (I), the method may discard (and optionally replace), or alternatively and equivalently truncate, the segment portions respective to a number of the last numeric integration steps. The replacement or truncation may be such that the resulting curve terminates exactly at the three-point-contact location. The number of segment portions may be a floating point number, i.e. having to truncate steps and/or fractions of steps. In such a case, the method may further include outputting the position of the three-point-contact points of the B-Rep for the radius value, and/or displaying a graphical representation of such three-point-contact points (e.g. in addition to displaying the one or more two-point contact curves). In line with examples introduced later, the determination of how many steps back to replace may be done by other differential equation solving which locates the 3-pt contact sphere (e.g. the second tracing block T2). In the case of condition (II), the method may optionally bisect the segment portion respective to the last numeric integration step, for example such that it terminates exactly at the face boundary. In case the second test has been performed regardless of the first test being positive, and if the two tests are positive, then condition (I) may prevail.

The testing of condition (I) may include intersecting a local sphere having a radius the order of R but smaller than R with a tessellation of the B-Rep. The local sphere may be of a radius higher than 0.9*R or 0.95*R, for example equal to 0.99*R. The local sphere may have the same center as the contact sphere (i.e., middle point of the two-point-contact curve). If the intersection has a non-null volume, then the method may evaluate that condition (I) is fulfilled. By intersecting a sphere with a tessellation of the B-Rep, the testing of condition (I) can be performed relatively fast. However, the tessellation introduces a discretization error to the exact geometry of the outer surface, relative to the B-Rep. This error corresponds to the tessellation resolution. By testing intersection of a local sphere having a radius smaller than the radius value of the contact sphere, the testing reduces probability of obtaining false positive results, and thus inappropriately stopping the integration.

When the condition (I) is fulfilled that the contact sphere intersects with a rest of the B-Rep, the determining S30 may include further solving another respective differential equation based on the B-Rep. As mentioned above, this may be to replace truncate the segment portion respective to the last numeric integration step. This other respective differential equation may be based on the same respective pair of surface parameterizations $\{s_1, s_2\}$, and further based on another surface parameterization, supporting the intersection, noted $s_3$. Parametrization $s_3$ is the one of the surface supporting the face containing the third portion (the face with which the intersection occurs). This third face may be the same as the face supported by $s_1$ and/or the same as the face supported by $s_2$, or it may be a different face of the B-Rep. With respect to the former case, it is noted that a three-point contact may occur, for a sphere with the radius value, between three different portions of the B-Rep belonging to a single and same face of the B-Rep (for example if said face is bended enough). Solving this other respective differential equation allows refining the last segment portion, to obtain the numerically precise location of the three-point-contact position (this is meant up to numerical tolerances, i.e. the precision of the respective floating point units).

As for the initial solving, the other respective differential equation's solving may include integrating the respective differential equation from an initial value. The other respective differential equation may have a common solution with the initial respective differential equation at the end of a previous numeric step (very last step in case of the truncation, earlier step in case of the replacement). Said common solution can be relied on for initializing a numeric integration of the other respective differential equation. Thus, the end of the curve at the last numeric integration step becomes a part of the initial value of the other respective differential equation's integration.

The other respective differential equation's solving may also be referred to as "tracing", since it also traces a curve (a final portion of the two-point-contact curve in the case of the replacement, a portion of the two-point-contact curve to be erased in the case of the truncations). An example of the tracing is referred to as T2 later. And as for the initial integration, the other differential equation's integration may comprise successive numeric integration steps each yielding a respective segment portion of the respective two-point-contact curve. At the end, the method may comprise bisecting the last respective segment portion so as to stop exactly at the three-point-contact position.

In line with the below, the first differential equation lives in $\mathbb{R}^4$ and provides four parameters (u,v,a,b) at its end. The second differential equation lives in $\mathbb{R}^7$ having additional parameters (c,d,l). As to obtain initial values for the latter parameters, the method may compute an orthogonal projection from the middle point of the sphere associated to the last parameters (u,v,a,b) to the third face $s_3$. Then (c,d) are the parameters of the point where the orthogonal projection is hitting $s_3$ and I is the length of this orthogonal projection].

The other respective differential equation may be the following:

$$DF^*(u(t^*),v(t^*),a(t^*),b(t^*),c(t^*),d(t^*),l(t^*))^*(u'(t^*),v'(t^*),a'(t^*),b'(t^*),c'(t^*),d'(t^*),l'(t^*))=0$$

DF* is a differential (e.g. Jacobian) with respect to a parameter t* (i.e., a variable parameterizing the considered differential/Jacobian), of an extended system function F*: $\mathbb{R}^7 \to \mathbb{R}^6$ provided by the following:

$$F^*(u,v,a,b,c,d,l)=(s_1(u,v)+R\,N_1(u,v)-[s_2(a,b)+R\,N_2(a,b)],s_1(u,v)+R\,N_1(u,v)-[s_3(c,d)+l\,N_3(c,d)])$$

$s_3$ is the other surface parameterization (where $s_3$ may be equal to $s_1$ and/or $s_2$, if the three-point contact occurs within only two faces or even a single face). $N_3$ is a respective normal map of $s_3$ (thus normal maps of the face parameterized by $s_3$). (c,d) is a respective parameter couple of $s_3$. l is a length of an orthogonal projection of a center of a sphere of radius R contacting $s_1(u,v)$ and $s_2(a,b)$. The orthogonal projection may be on the other surface $s_3$. Finally, (u'(t),v' (t*),a'(t*),b'(t), c'(t),d'(t),l'(t)) are respective derivatives of u v,a,b,c,d,l with respect to t*.

This system function describes the three-point contact of a deformable sphere at sets of three points $\{s_1(u(t*),v(t*))$, $s_2(a(t*),b(t*))$, $s_3(c(t*),d(t*))\}$, where the deformation is a retractation or extension in the direction orthogonal with the intersected face, passing by the three-point-contact position. Solving such a function system yields a particularly accurate result.

In particular, in case the method truncatesa part of the initially computed trajectory, the determining S30 may comprise evaluating if l(t*) is higher than R at each numeric integration step, and continuing the integrating as long as the test is negative. When l becomes larger than R, this means that the three-point contact has been passed. In such a case, the method may bisect the last segment portion to stop the curve exactly at the three-point-contact position. The extremity of the bisected segment portion may be outputted as the three-point-contact position. In case the method rather replaces the last segment, the principle is the same, except that the determining S30 may rather continue the integrating as long as the test is positive.

The solving of the respective differential equation, DF(u (t),v(t),a(t),b(t))*(u'(t),v'(t),a'(t),b'(t))=0, may include finding a zero $(u_0, v_0, a_0, b_0)$ of F. The initial value for integrating the respective differential equation may then be given by $(u(0), v(0), a(0), b(0))=(u_0,v_0,a_0,b_0)$.

The finding of the zero may be performed in any manner. For example, the finding of the zero may include a root-finding algorithm, on the B-Rep, from a pair of starting points of the B-Rep. This provides robustness to the method. In particular, the root-finding algorithm may be a Newton iteration.

The determining S30 may set the pair of starting points for the root-finding algorithm in any manner. For example, the determining S30 may include tessellating the B-Rep, and processing the tessellation. The tessellation (i.e., result of the tessellating) may be a mesh, of any kind depending on the tessellation algorithm implemented.

The processing includes identifying, for the radius value R, one-point-contact vertices and non-contact vertices. In other words, the method here performs a global discrete HID. This may be performed in any manner, including according to the prior art. For example, the identifying may include touching each vertex of the tessellation with a contact sphere of a radius equal to R, and in a direction normal to the mesh at the vertex and toward the exterior of the vehicle from the mesh (which represents the outer surface). The method may comprise determining the normal direction in any manner, for example as a means of the normal vectors of all faces adjacent to the touched vertex of the mesh. The identifying may then include evaluating if the contact sphere intersects other parts of the mesh with a non-null volume. If there is a non-null intersection, then the vertex is a non-contact vertex (since the intersection would forbid the sphere to contact the vertex by collision). Else, if the intersection is of null volume, then the vertex is a one-point contact vertex. The global discrete HID may optionally perform other processing, such as marking one-point contact vertices as critical or uncritical vertices depending on a curvature of the outer surface at the vertex, and/or modifying the mesh around such critical vertices.

The processing then includes defining transition edges. Each defined transition edge is an edge bounded by a respective one-point-contact vertex and a respective non-contact vertex. In examples, all edges of the mesh bounded by a respective one-point-contact vertex and a respective non-contact vertex may be defined as transition edges.

The determining S30 may then include setting the pair of starting points for the root-finding algorithm based on a respective transition edge. A transition edge corresponds to a region of the B-Rep where a two-point contact is likely to occur. Locations of the respective transition edge may thus be good starting points for finding a zero of F, and therefrom integrating of the differential equation.

When tessellating the B-Rep, each tile of the mesh (i.e., mesh face) corresponds to a respective portion of the B-Rep, and the tessellation algorithm may keep track of such correspondence. In other words, the tessellation algorithm may output information for defining a bijection between positions of B-Rep faces and positions on the mesh, and each point of the B-Rep may be interpreted into a unique position of the mesh, and reciprocally, each position of the mesh may be interpreted into a unique point of the B-Rep.

The setting of the pair of starting points for the root-finding algorithm may include a scheme iterated until the root-finding algorithm finds the zero. The iterated scheme may comprise selecting a transition edge. The transition edge may be an edge of the tessellation of one of the face(s) supported by the respective pair of surface parameterizations $\{s(u,v), s_2(a,b)\}$. The iterated scheme may further comprise establishing a pair of candidate starting points based on the selected transition edge. For example, the establishing may include establishing a first point of the pair as a point of the B-Rep corresponding to a first position of the transition edge (any position between the two vertices of the transition edge, and possibly but not limited to one of said vertices), and establishing a second point of the pair as another point of the B-Rep which is a candidate for substantially forming with the first point a two-point-contact pair. This may include, for example, bisecting the selected transition edge. An example is provided later. The iterated scheme may then comprise attempting to find a zero of F, by running the root-finding algorithm, on the B-Rep, from the pair of candidate starting points. If the attempt is successful, the iteration may stop. Otherwise, a new transition edge may be selected. The candidate starting points may also be referred to as "approximated touching points".

The second aspect of the method is now discussed.

According to the second aspect, the determining S30 includes, for each respective pair of portions of a plurality of pairs of portions of the B-Rep, a respective two-point-contact-curve computing algorithm. The computing algorithm is based on the respective pair of portions. And the computing algorithm is parallelized over the plurality of pairs of portions.

By "two-point-contact-curve computing algorithm", it is meant an algorithm which attempts to compute all two-point-contact-curves of the respective pair of portions (if any), said respective pair of portions being provided as an input to the algorithm. For an input pair of portions, the computing algorithm may well output a null result, e.g. simply determine that no two-point-contact-curve exists between the input pair of portions.

By "plurality of pairs of portions of the B-Rep", it is meant any predetermined set of pairs of portions of the B-Rep. A "pair of portions" of the B-Rep is in turn a set of exactly two portions (or parts) of the B-Rep. The two portions of a pair may be either different or the same. With respect to the latter case, it is noted that a two-point contact may occur, for a sphere with the radius value R, within a single and same portion of the B-Rep (for example if said portion is bended enough).

Now, the computing algorithm is parallelized over said plurality of pairs of portions. This means that the method comprises launching multiple parallel threads of the same computing algorithm, each thread taking as input a respective pair of portions of the plurality. Such a parallelizing may be performed by any hardware configured for parallel processing, such as a massively parallel processor (MPP) or a GPU.

Each portion of each pair of portions among the plurality of pairs of portions may be a respective face of the B-Rep. In other words, the plurality of pairs of portions is a plurality of pairs of faces of the B-Rep. Yet in other words, the determining S30 includes, for each respective pair of faces of the plurality of pairs of faces, a respective two-point-contact-curve computing algorithm based on the respective pair of faces, and the computing algorithm is parallelized over the plurality of pairs of faces.

The plurality of pairs of portions may consist (exactly) of all pairs of a set of portions of the B-Rep which forms a partition of the B-Rep. The considered partition of the B-Rep may simply be the set of faces of the B-Rep, and the computing algorithm may be parallelized over the set of all pairs of faces of the B-Rep (including pairs of twice the same face). This provides a good tradeoff between gain of time offered by calculations being performed simultaneously during the parallelization, and loss of time due to decoupling, waiting and recoupling threads. This proves to be the most efficient partitioning for the purpose of vehicle impact analysis based on a B-Rep of a vehicle.

As in the first aspect, the determining S30 may include tessellating the B-Rep, and processing the tessellation. The tessellation (i.e., result of the tessellating) may be a mesh, of any kind depending on the tessellation algorithm implemented.

In such a case, the processing includes identifying, for the radius value R, one-point-contact vertices and non-contact vertices. In other words, the method here performs a global discrete HID. This may be performed in any manner, including according to the prior art. For example, the identifying may include touching each vertex of the tessellation with a contact sphere of a radius equal to R, and in a direction normal to the mesh at the vertex and toward the exterior of the vehicle from the mesh (which represents the outer surface). The method may comprise determining the normal direction in any manner, for example as a means of the normal vectors of all faces adjacent to the touched vertex of the mesh. The identifying may then include evaluating if the contact sphere intersects other parts of the mesh with a non-null volume. If there is a non-null intersection, then the vertex is a non-contact vertex (since the intersection would forbid the sphere to contact the vertex by collision). Else, if the intersection is of null volume, then the vertex is a one-point contact vertex. The global discrete HID may optionally perform other processing, such as marking one-point contact vertices as critical or uncritical vertices depending on a curvature of the outer surface at the vertex, and/or modifying the mesh around such critical vertices.

The processing then includes defining transition edges. Each defined transition edge is an edge bounded by a respective one-point-contact vertex and a respective non-contact vertex. In examples, all edges of the mesh bounded by a respective one-point-contact vertex and a respective non-contact vertex may be defined as transition edges.

Furthermore in such a case, the computing algorithm takes as input, for each respective pair of portions, a respective set of transition edges of the respective pair of portions (e.g., faces). The respective set of transition edges may consist in all transition edges of the respective pair of portions (e.g., faces), or a subpart thereof.

This improves speed of the algorithm. The subpart may consist of all transition edges detected as susceptible to lead to a two-point-contact-curve. An example of such detection is provided below. If no such transition edge is detected or there is no transition edge at all, the computing algorithm has no input, and may thus merely output a null result for the respective pair.

When the determining S30 includes tessellating the B-Rep and processing the tessellation, the tessellating may be parallelized over the set of portions (e.g., set of faces). This increases speed of the method, as different portions (e.g., faces) of the B-Rep may be tessellated separately in safe threads. In such a case, the processing and the computing algorithm may be performed after the tessellating has ended. This allows obtaining a fixed mesh before processing it, such that the processing and the mesh construction do not enter into conflict. This increases thread safety.

When the determining S30 includes tessellating the B-Rep and processing the tessellation, the processing may be parallelized over the set of portions (e.g., set of faces). This increases speed of the method, as different tessellated portions (e.g., faces) of the B-Rep may be processed separately in safe threads. In such a case, the computing algorithm may be performed after the processing has ended. This allows obtaining a fixed mesh before executing the computing algorithm thereon. This increases thread safety.

When the determining S30 includes tessellating the B-Rep and processing the tessellation, for each respective pair of portions (e.g., faces), the computing algorithm may include, an iterative scheme repeated until the respective set of transition edges is empty. The iterative scheme comprises selecting a transition edge from the respective set of transition edges (inputted to the two-point-contact-curve computing algorithm). The iterative scheme also comprises attempting to trace of a two-point-contact curve based on the selected transition edge. If the tracing attempt is successful, the iterative scheme comprises deleting, from the respective set of transition edges, all transition edges intersecting the traced two-point-contact curve. This allows reducing risks to trace twice the same two-point-contact curve. If the tracing attempt is not successful, nothing is traced and thus nothing occurs. The iterative scheme further comprises deleting, from the respective set of transition edges, the selected transition edge. This ensures eventual ending of the iteration, and this reduces risks to trace twice the same curve, thus increasing efficiency.

The determining S30 may comprise attempting to establish one or more pairs of candidate starting points. Each candidate starting point belongs to a respective portion of the respective pair of portions (e.g., faces). In other words, the determining S30 looks for a candidate pair of starting points within the considered pair of portions, with one candidate starting point per portion. Furthermore, the establishing is attempted for each pair of candidate starting points based on a respective transition edge of the respective pair of portions (thus belonging to either one of the two portions of the pair. The establishing attempt may loop over all transition edges of the respective pair of portions (e.g., faces), and the loop may itself be within a more global loop over all transition edges of the tessellation. This allows exhaustiveness. The establishing attempt may be parallelized over the plurality of pairs of portions or over the set of portions. Both options increase speed of the determining S30.

The respective set of transition edges inputted to the computing algorithm may be populated based on the result of the establishing attempt. In particular, the determining S30 may add to the respective set of transition edges, each transition edge that allows the establishing attempt to succeed. The respective set may be initially empty, and eventually populated with all such added transition edges.

Thus, if the establishing attempt is unsuccessful (i.e. no pair of candidate starting points is established), the determining S30 may stop for the respective pair of portions (e.g. faces), and thus the computing algorithm may merely output a null result for the respective pair, as the computing algorithm has a null input.

If on the contrary the establishing attempt is successful for a respective pair of portion (e.g., faces), then the computing algorithm may be performed as follows.

The selected transition edge is, by definition, a respective transition edge of the respective set of transition edges inputted to the computing algorithm, thus a respective transition edge based on which the determining S30 was successful in establishing a respective pair of candidate starting points.

In such a case, the tracing attempt comprises attempting to find, starting from the respective pair of candidate starting points, a respective initial point, the initial point belonging to the two-point-contact curve. If the finding attempt is successful, the tracing attempt comprises tracing the two-point-contact curve from the initial point, thus succeeding. Otherwise, if the finding attempt is unsuccessful, the tracing attempt also fails. In such a case, the scheme goes to the next iteration where the computer algorithm selects another transition edge from the respective set of transition edges, and re-attempts the tracing. This is iterated until the respective set of transition edges is empty. If all tracing attempts were unsuccessful, the computing algorithm may merely output a null result for the respective pair.

As in the first aspect of the method, the tracing (if successful) may include integrating a respective differential equation. In such a case, as in the first aspect of the method, the differential equation is based on the pair of surface parameterizations of the respective pair of portions. The differential equation may be the same one as in the first aspect of the method, that is, DF $(u(t),v(t),a(t),b(t))*(u'(t),v'(t),a'(t),b'(t))=0$. The solving of said respective differential equation may include finding a zero $(u_0, v_0, a_0,b_0)$ of F. The initial value for integrating the respective differential equation may then be given by $(u(0), v(0), a(0), b(0))=(u_0,v_0,a_0,b_0)$.

As in the first aspect of the method, the finding of the zero may be performed in any manner. For example, the finding of the zero may include a root-finding algorithm, on the B-Rep, from the pair of candidate starting points of the B-Rep established (if the establishing attempt was successful). This provides robustness to the method. In particular, the root-finding algorithm may be a Newton iteration.

As in the first aspect of the method, the establishing attempt may include establishing a first point of the pair as a point of the B-Rep corresponding to a first position of the respective transition edge (any position between the two vertices of the respective transition edge, and possibly but not limited to one of said vertices), and attempting to establish a second point of the pair as another point of the B-Rep which is a candidate for substantially forming with the first point a two-point-contact pair. This may include, for example, bisecting the respective transition edge. An example is provided later. The finding attempt may then consist in attempting to find a zero of F, by running the root-finding algorithm, on the B-Rep, from the pair of candidate starting points.

Implementations of the method are now discussed with reference to FIGS. 9-50, where some of the figures represent real screenshots of a tested prototype software in line with said implementations.

Figure 9:
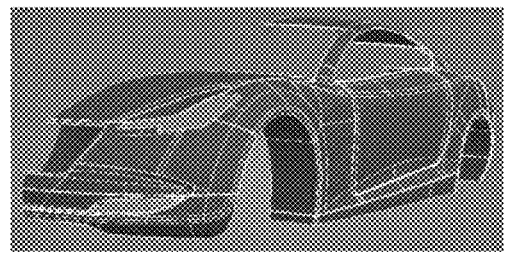
Figure 10:
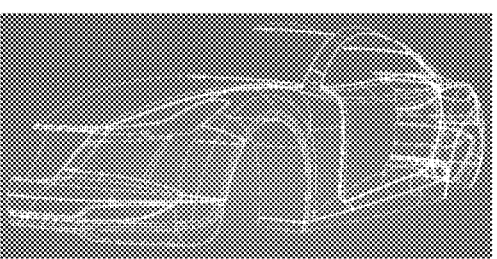

FIGS. 9-10 show an example of an input B-Rep geometry which may be provided at S10. The shown B-Rep represents an outer surface of an exterior part of a car, in specific a half of a car body part. The following discussion will refer to this example, unless mentioned otherwise.

In the discussed implementations, the determining S30 includes tessellating the B-Rep, and processing the tessellation. The processing includes identifying, for the radius value, one-point-contact vertices and non-contact vertices. Said identifying may be performed according to any known global head impact diagnosis (HID). The implementations have been tested with the global HID provided by Dassault Systèmes' ICEM Surf, which solely works on the tessellation of the input B-Rep geometry, which is why it is referred to as "discrete". Thus, the discussed implementations and the tested prototype build upon this existing global and discrete HID functionality.

A global and discrete HID functionality may involve only one selection of the user, and thus is easy to use. However, the precision of the result relies on the precision of the discretization, i.e. the mesh precision. This can be refined arbitrarily via the tolerance, respectively, length parameters, such that the runtime complexity scales quadratic in these parameters. Thus, the existing functionality is acceptable for determining one-point-contact vertices (as done by the global and discrete HID functionality), but is less appropriate for the determining at S30 of the two-point-contact curves, and also the isolated three-point-contact spheres (and this is where the provided method intervenes and adds to the existing functionality).

Figure 11:
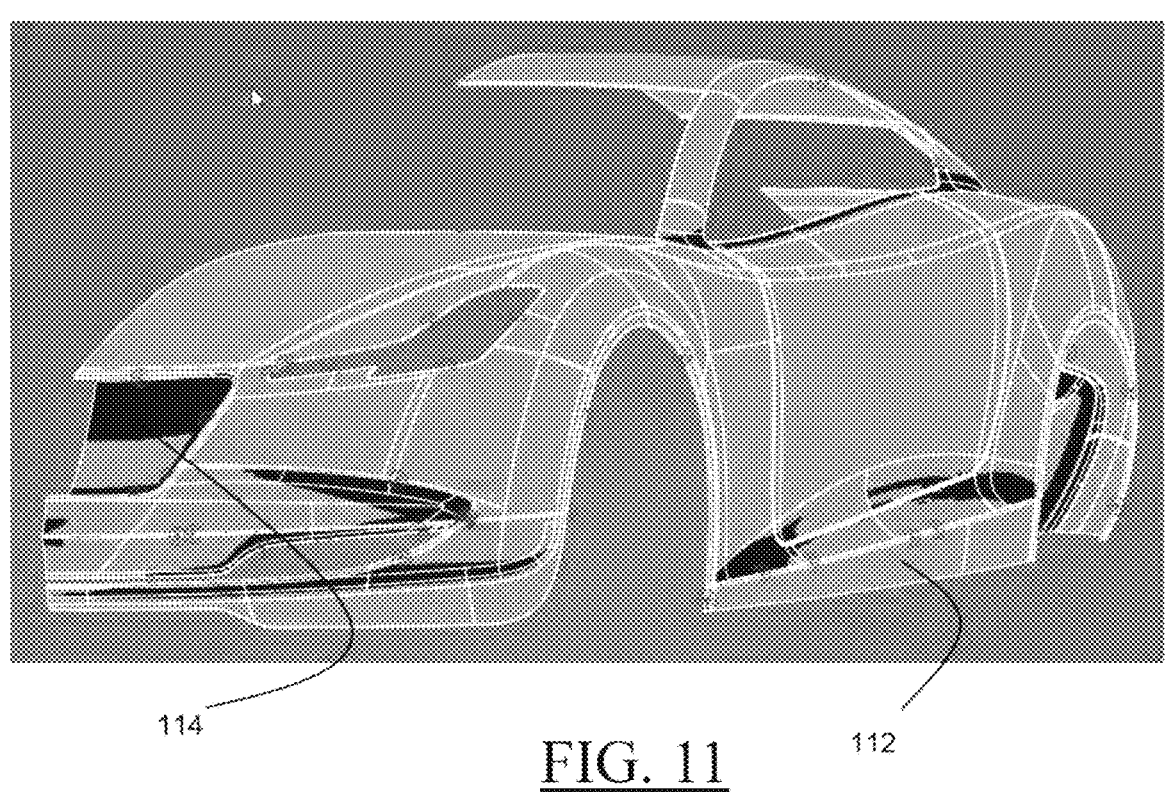
Figures 12, 13, 14, 15:
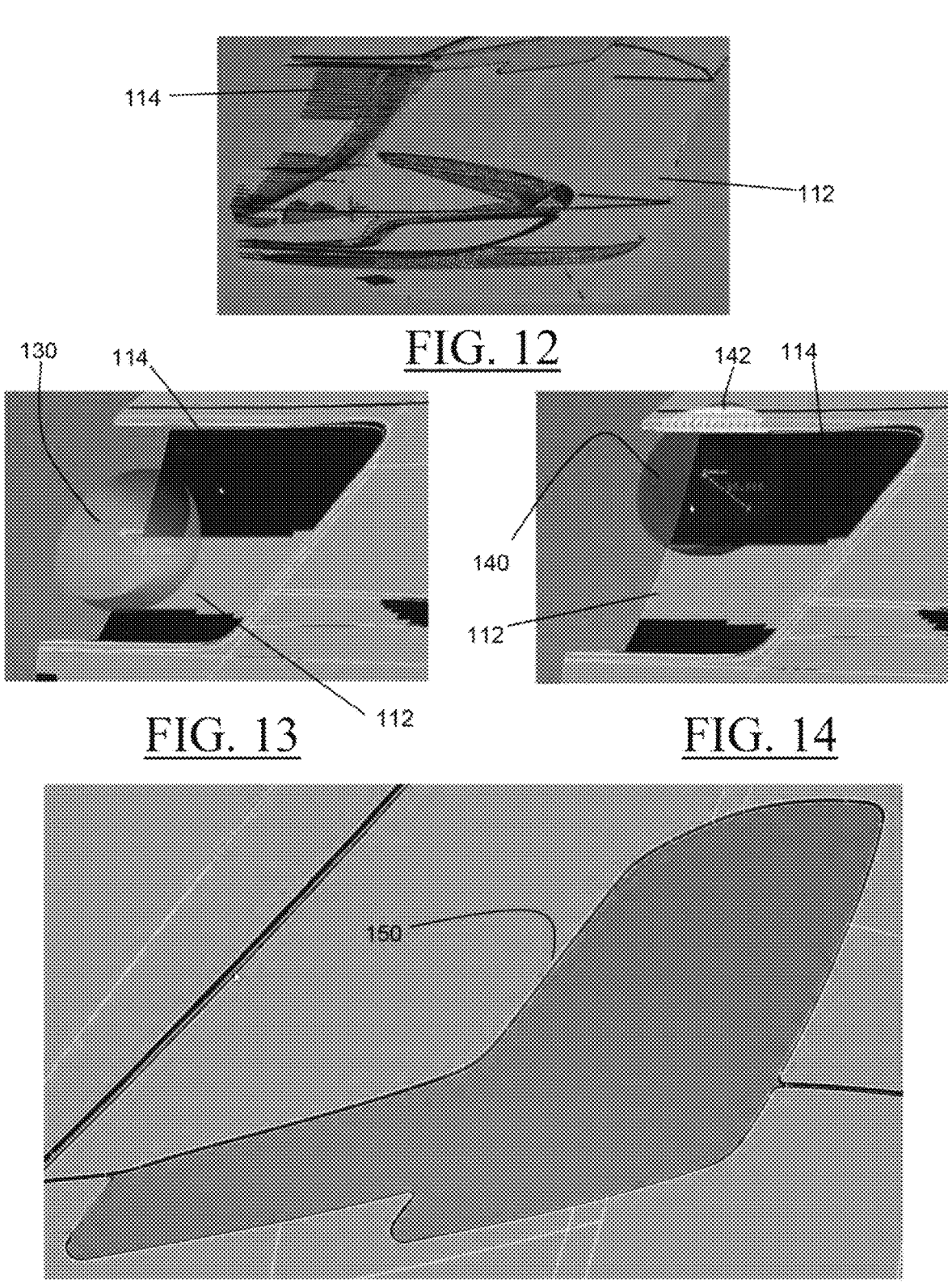

FIGS. 11-12 show the result of the discrete HID on the input B-Rep, where FIG. 12 shows a vertex-wise (zoomed-in) visualization of the result of FIG. 11. As can be seen, a relatively high accuracy can be obtained with length=5 millimeters. The length parameter in general may be adjusted to the particular example at stake. In this case a very small length, i.e. length=5 millimeters was used and this may generally be a good value for obtaining very precise results. Green marked regions 112 are so-called active vertices, which are vertices, where a respective one-point contact sphere does not intersect the input geometry, except in its attachment point (i.e., one-point-contact vertices). All other vertices 114 are called inactive and are marked blue (i.e., non-contact vertices). The algorithm works per vertex (see FIG. 12), and with standard shading the method may obtain the result in FIG. 11.

Referring to FIGS. 13-14, to understand and control the result of the algorithm the user has the option to perform a so-called visual inspection functionality (or "inspect"), where the user selects a vertex, such that a respective one-point-(half/hemi-)contact sphere 130,140 is visualized: green sphere 130 for active, blue sphere 140 for inactive. On FIG. 13, an active vertex was selected, such that one-point-contact sphere 130 does not intersect with the rest of the geometry, and on FIG. 14 an inactive vertex was selected, such that one-point-contact sphere 140 intersects. On FIG.

14, the blue sphere 140 clearly intersects the rest of the geometry, which is also indicated by the visualization via yellow markers 142.

Referring to FIG. 15, which represents a close up of the front light section of FIGS. 11-12 with several critical regions, the prior art functionality of the discrete HID is tailored to address curvature restrictions on certain regions of the exterior (mainly car front) and interior (mainly dashboard) and are associated to one-point contact spheres which attach at points of the respective regions. The critical regions with respect to this part of the specification may be marked red by the discrete HID. These are the marked regions 150 with critical curvature with respect to one-point-contact spheres.

However:

The discrete HID considers only one-point-contact spheres.

Figure 19:
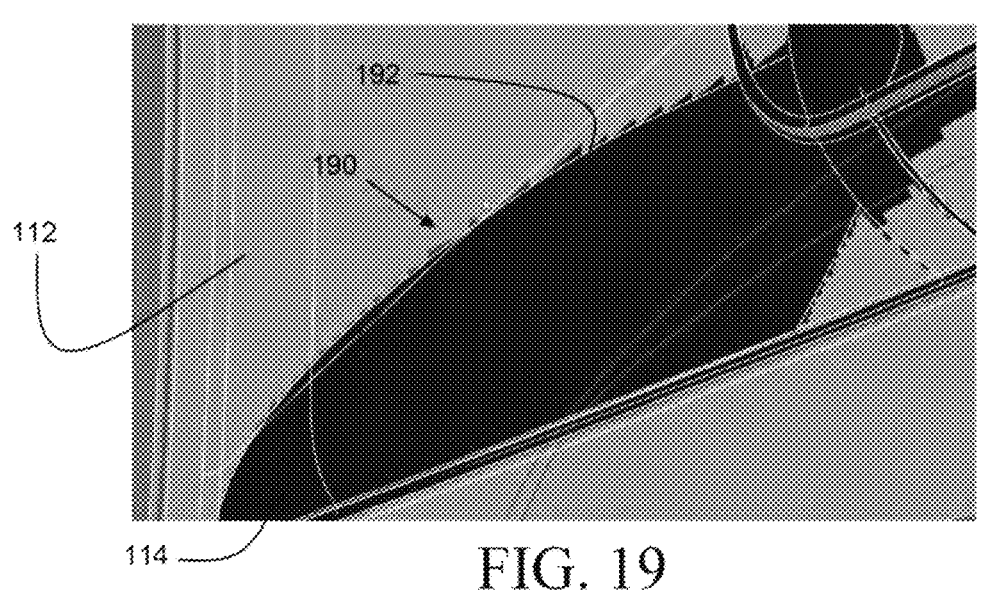
Figure 20:
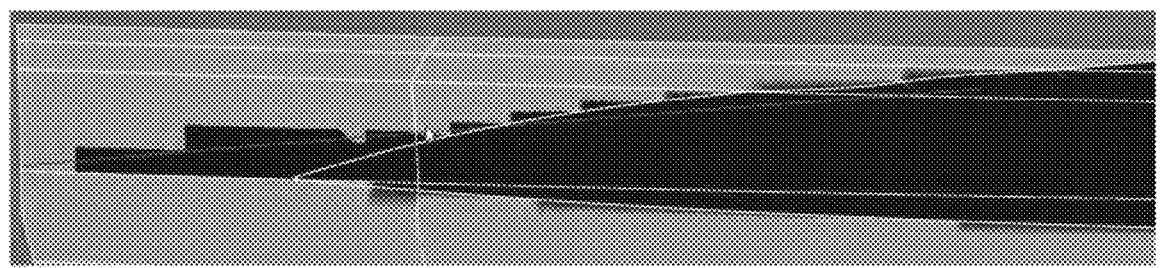

Furthermore the precision of the result depends on the mesh-parameters and is essentially always only an approximation to a result which would use the continuous B-Rep input geometry. Referring to FIGS. 19-20, this can be identified best in the transition 190 from green regions 112 to blue regions 114, where the mesh dependence of the result is clearly visible.

Although approximations of these transitions are visible, there is no possibility to inspect the two- or three-point-contact spheres. This is due to the fact, that the algorithm works vertex wise, such that on a transition edge (an edge in the mesh which has one active and one inactive vertex), although there is a point on the edge corresponding to a 2PCS, this point is not computed and thereby not represented in the resulting data model and thereby not accessible for an inspection of the user.

One-point-contact spheres model the point of first impact, but depending on the angle in which the impact occurs a head or knee of an accident participant will typically slip on the surface of the vehicle until it reaches a configuration where a second contact point arises, which corresponds to a two-point-contact sphere within the static geometric model. At this point the forces applied are more severe than in the one-point-contact-case. However, there is still one degree of freedom, i.e. the head/knee (again depending on the angle of impact) typically slips along a curve of two-point-contact spheres, until a third contact point appears. The latter corresponds to a three-point-contact sphere, which is the final configuration where all forces of the impact unload on the accident victim. Thereby the two- and three-point-contact spheres are geometric configurations which are helpful in the analysis and simulation of an accident.

Figures 16, 17, 18:
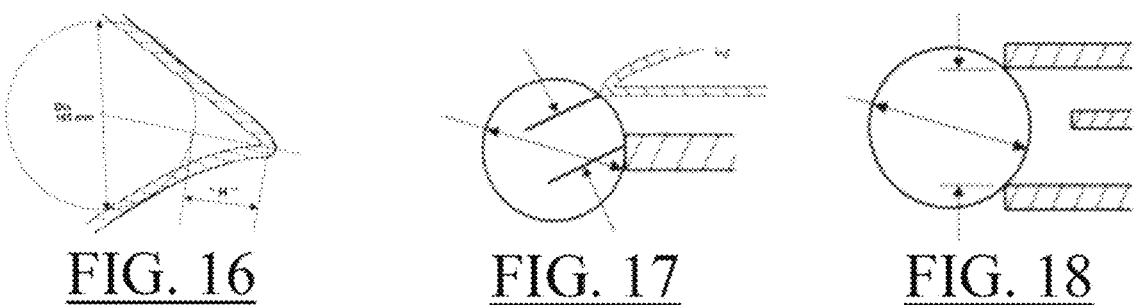

Referring to FIGS. 16-18 which represent drawings extracted from ECE R-26 representing examples for two-point-contact sphere related specifications, the earlier-mentioned specifications (e.g., defined in EU and US regulations) additionally impose restrictions with respect to curvature criteria in much more restricted regions, which are associated to the contact points of two- and three-point contact spheres.

The inspection process which assures the compliance of a new vehicle with respect to the specifications is an extensive process, which may rather be incorporated during its design process at multiple stages. This starts with early designs, which may rather avoid the pitfall of providing a design draft which in the later stages of the design and manufacturing process cannot be brought in line with safety regulations. In the middle phase of a design process, there are typically multiple cycles of small and medium-sized redesigns as the initial design proposal now has to fulfill several additional boundary conditions, which are induced from engineering the car from a technical point of view. In the later stage, where a fully functioning prototype is available, there is finally a control process where the local authorities check the prototype for compliance with safety regulations, which especially include pedestrian and passenger safety.

The latter focuses on important parts of the human body, and so, as to estimate head or knee impact on pedestrians or passengers during an accident, the respective specifications use static geometric configurations which consider spheres (as models for heads or knees) as they collide with the exterior or interior of a vehicle. These in turn are geometrically speaking so-called contact spheres which may be computed for a given geometry (the vehicle in this example). The generic geometric situation for a surface input geometry is that there exists two-/one-, respectively, zero-dimensional sets of one-point-/two-point, respectively, three-point contact spheres. A first technical problem which is addressed by the implementations of the method is their computation. A second technical problem is how to effectively accompany the compliance process, which automotive companies have to assure during each and every vehicle development. The implementations of the method propose interactive inspection functions for the two- and three-point-contact spheres, and respective visualizations which can be carried out in real-time after the geometric contact sphere problem is solved.

The implementations of the method consist of multiple parts easing the process of safety compliance and starts in its core with the computation of all relevant 2- and 3-point-contact spheres. However, the operator is actually much more general. It is essentially an intersection operator for offset surfaces. It can for example be easily adapted to yield the results of a surface-surface intersection (by setting the offset of the input surfaces to zero).

Furthermore, the inspection functionalities of the implementations of the method enable the designers and engineers involved in the development process of a vehicle as well as the inspectors of the respective authorities to analyze the critical configurations associated to the geometric situations represented by two- and three-point-contact spheres. These inspection functionalities may typically be realized by a complex manual process which involves the manual construction of such geometric configurations bit-by-bit. This not only corresponds to hours of work of a designated specialist, but also interrupts the development respectively design process at multiple occasions.

A first feature of the implementations of the method is an algorithm for computing curves of two-point-contact spheres, relying on numerical solving associated to ordinary differential equations, which traces a zero set, describing the local two-point-contact spheres and the differentiation of orthogonal projections. So as to globalize this result in each step of the numerical integration process, a complex intersection algorithm may be used, which constructs a bounding box hierarchy of the input geometry and solves the intersection problem of a given sphere with the input geometry in logarithmic time-complexity. This solves the technical problem of computing all two-point and three-point contact spheres (which touch at differentiable points of the input geometry).

A second feature of the implementations of the method is given by respective inspection functionalities which allow the user to investigate the computed contact spheres in an interactive way in real-time. This especially includes the possibility to select a two-point-contact sphere and move it along the input geometry in real-time. The latter is accompanied with visualizations which allow the user to control the accuracy of the computed result and deduct important measures to ensure the compliance to the safety specifications. This solves the technical problem of designing an efficient process for incorporating the compliance process into a typical design and engineering process for the development of new vehicles as carried out by automotive companies in Europe, the US and Asia.

Referring to FIGS. 19-20, the continuous HID offered by the implementations of the method provides high accuracy compared to the existing discrete HID. This is due to the fact, that all computations on the new approach rely on the continuous input geometry, rather than on a discretization. This allows for computations which are accurate up to the numerical tolerance of the B-Reps used for the input description and the floating point units of modern CPUs.

FIGS. 19-20 shows a comparison of the discrete HID and the continuous HID, where the two are displayed superposed. The discrete HID produces blue regions 114 and green regions 112, of which transitions 190 roughly describe touching lines of two-point-contact spheres. Those are neither accurate, nor are they accessible for inspection. The continuous HID provides the yellow touching lines 192, which are not only precise with respect to numerical tolerance, but also are selectable and allow for a thorough inspection.

Figure 21:
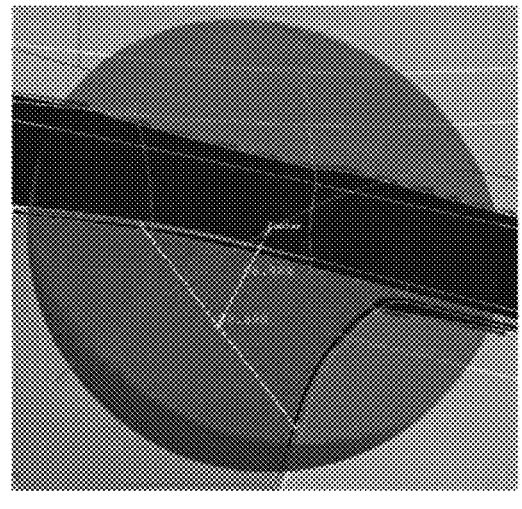
Figure 22:
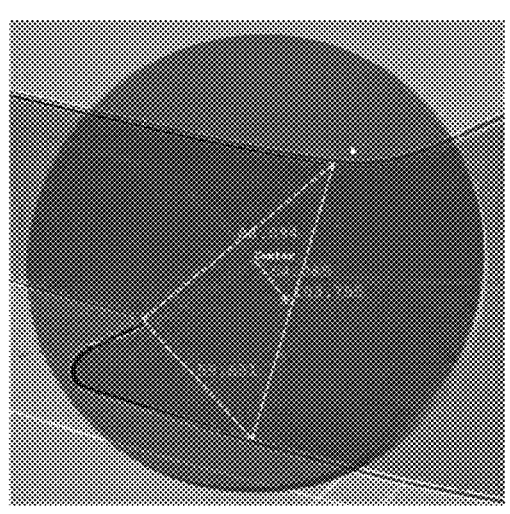

As shown on FIGS. 21-22, the nature of the result of the continuous HID allows for inspecting two- and three-point-contact spheres, which is not possible in the discrete context as those entities are simply not computed by the discrete approach. FIGS. 21-22 show examples for a two-point and a three-point contact sphere inspection with visualization of respective measures. These visualizations are all geometric entities which are associated to the contact spheres inspected, i.e. the sphere itself (visualized as a half-sphere or hemi-sphere), the contact points and related distances. Furthermore the inspection functionalities of the continuous HID allow the middle point of a two-point-inspect-sphere to be dragged along its associated middle curve.

A Global Contact Sphere algorithm (i.e. part of the determining S30, also referred to as "continuous HID-algorithm") of the implementations uses the result of the regular Head Impact Diagnosis for its start value computation, as well as for quickly finding possible face pairs (on which a potential two-point-contact sphere could be placed). Therefore, a more accurate result of the regular Head Impact Diagnosis produces better Global Contact Sphere results. This is a trade-off between accuracy and performance.

Implementations of the continuous HID-algorithm are now discussed. The discussion provides a step-by-step description via respective flowcharts.

Figure 23:
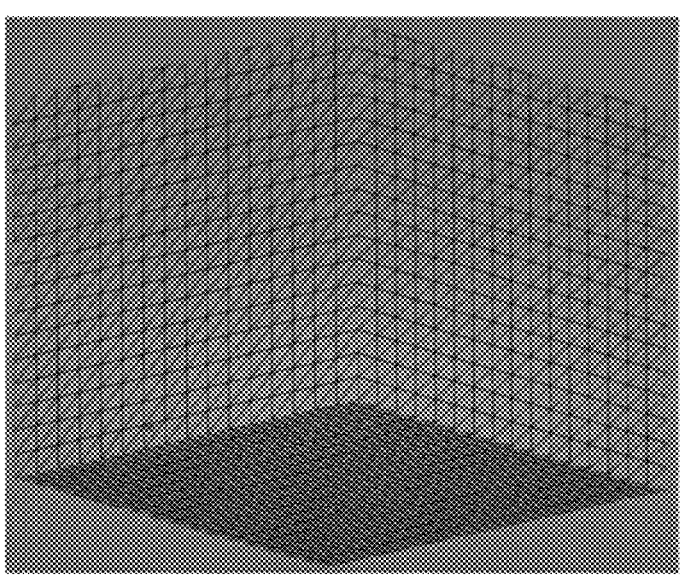

Referring to FIG. 23, this is exemplified along by giving in-between results of the contact sphere algorithm, applied to a very simple input geometry, in the following called "corner". The latter is sometimes visualized as a mesh as to ease the explanation of the parts of the algorithm, which incorporate the mesh. FIG. 23 shows a corner consisting of three B-Rep-surfaces as simple input geometry.

Figure 24:
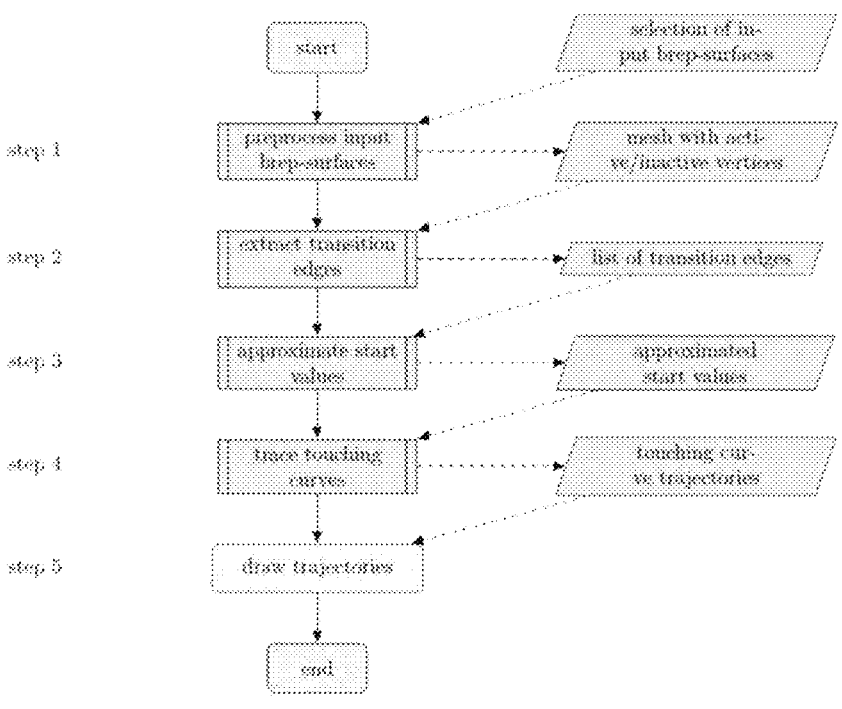

Referring to FIG. 24, the top level flow of the contact sphere algorithm consists of five steps.

Figure 25:
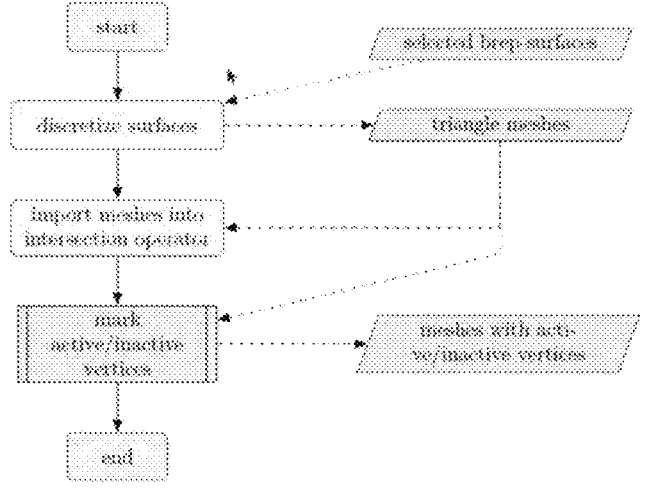
Figure 26:
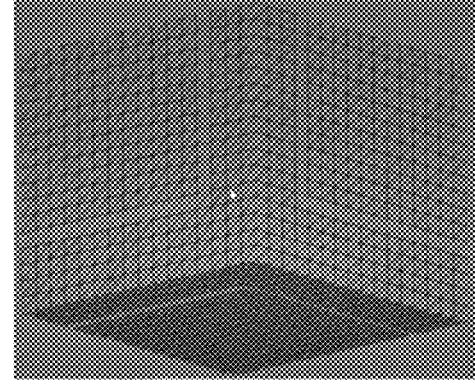

FIGS. 25-26 show respectively a flowchart of the surface pre-processing (step 1 and step 2), and the result after step 2 for the simple example.

Referring to FIG. 25, step 1 and step 2 are pre-processes, where step 1 is the one-point-contact discrete HID of ICEM Surf and step 2 is the extraction of transition edges. In step 1 the input provided by a single selection of the user is used to construct a bounding box hierarchy then used by an intersection operator, which firstly performs an intersection test of a one-point-contact sphere attached to each vertex in the mesh with the whole discretized input geometry. The constructed intersection operator is also used within later steps of the algorithm so as to perform intersection tests of arbitrary spheres with the input geometry in logarithmic time complexity. This is done in logarithmic time complexity.

Referring to FIG. 26, the result is a mesh where each vertex is tagged either active in case there is no intersection with the input geometry (i.e. one-point-contact vertex), or inactive otherwise (i.e. non-contact vertex). In step 2 the algorithm extracts a set of transition edges, whose two vertices are tagged differently, from the results of step 1.

Figure 27:
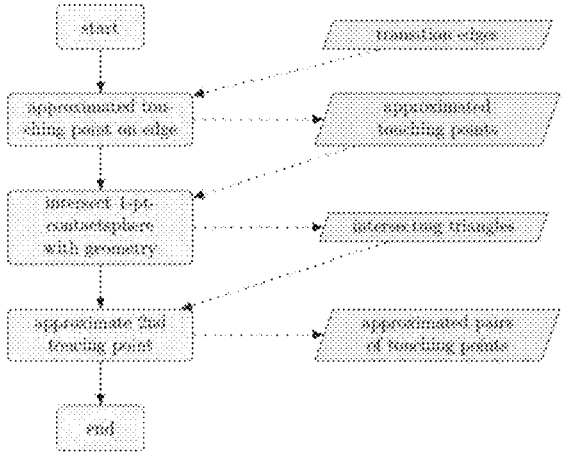
Figure 28:
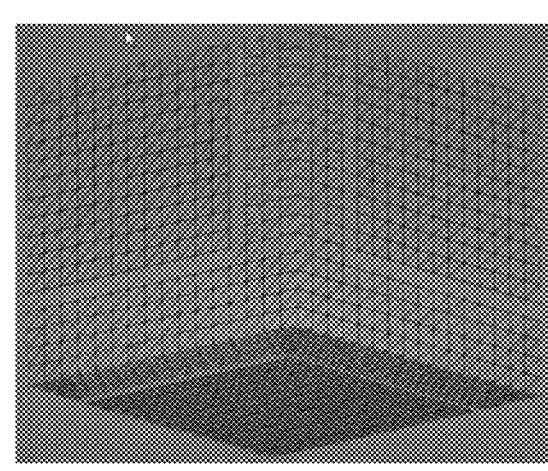

FIGS. 27-28 show respectively a flowchart for the approximation of the touching points of two-point-contact spheres (step 3) and the result for the simple example. After step 2, each transition edge forms a good candidate for one of the touching points of a two-point-contact sphere. The associated second touching point for each transition edge is approximated in step 3 (see FIG. 27). In this step, firstly for each transition edge a bisection is performed on the edge with the help of the previously constructed intersection operator, so as to obtain a reasonable good approximation for the first touching point of the desired two-point-contact sphere. In this process the intersection operator yields a good candidate for the second touching point. The result of step 3 is, for each transition edge, a reasonable approximation for the pair of touching points as depicted in FIG. 28.

Figure 29:
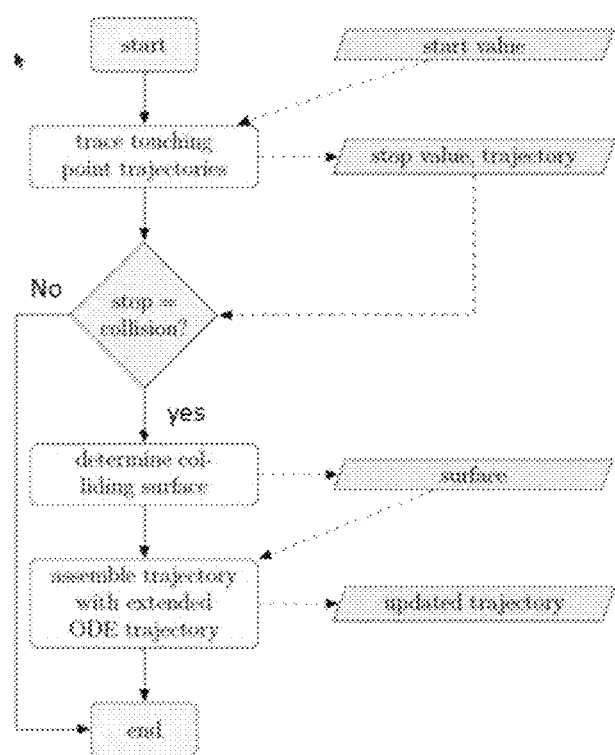

FIG. 29 shows a flowchart of the tracing process (step 4). In step 4, for each pair of approximated touching points one performs a zero-finding or root-finding algorithm (as for example a Newton method), so as to obtain a true zero (up to numerical tolerance) of the underlying system function. This in turn is used as a start value for numerically integrating the ordinary ODE-system, obtained from applying the implicit function theorem to the system function. The resulting trajectory contains all information to extract the two touching curves and the middle curve of the one-dimensional family of two-point-contact spheres. However, so as to obtain a global result in every step, the initially constructed intersection operator is used to check for intersections of a slightly modified (smaller radius, same middle point) version of the current contact sphere with the input geometry. The numerical integration (using for example a Runge-Kutta method) stops as soon as the intersection operator detects an intersection. In this stopping point the intersection operator provides a reasonable candidate vertex of the colliding surface mesh, which is used as a starting point for a Newton iteration providing the orthogonal projection of the middle point of the sphere to the colliding surface.

Figure 30:
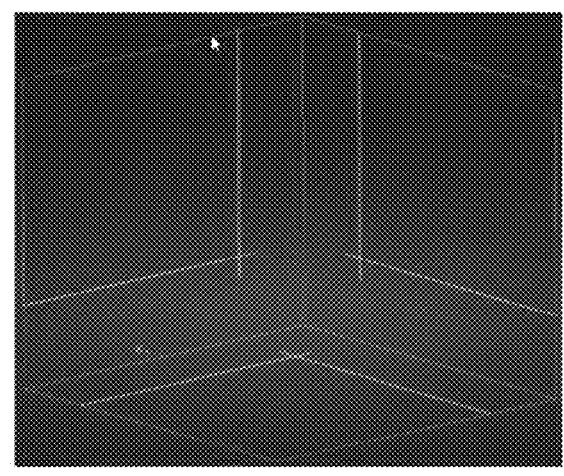

FIG. 30 shows the result of performing this tracing step without any truncation of the last segment portion.

Figure 31:
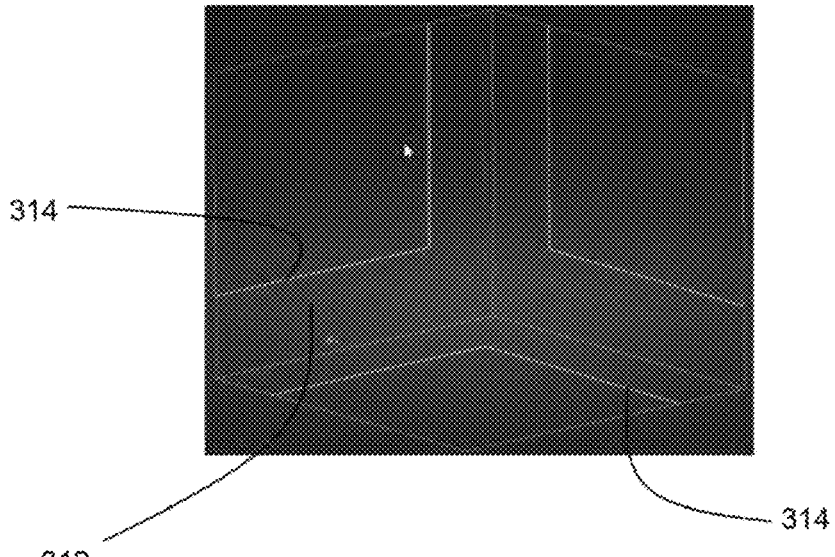

Referring to FIG. 31, in order to perform such a truncation afterwards, the algorithm may trace from the stopping point of the previous integration process backwards using an extended ODE-system, which additionally describes the infinitesimal change of the constructed orthogonal projection. Now the backward integration stops as soon as the length of the orthogonal projection is bigger than the original radius of our contact spheres. This is bisected properly so as to yield a high accuracy.

As shown on FIG. 31, this yields not only the numerical precise stopping point for the curve of two-point-contact spheres, but also corresponds to a three-point-contact sphere.

Everything is drawn in step 5, where touching curves 314 are depicted yellow and the associated curves 312 of middle points are depicted red.

Figure 32A:
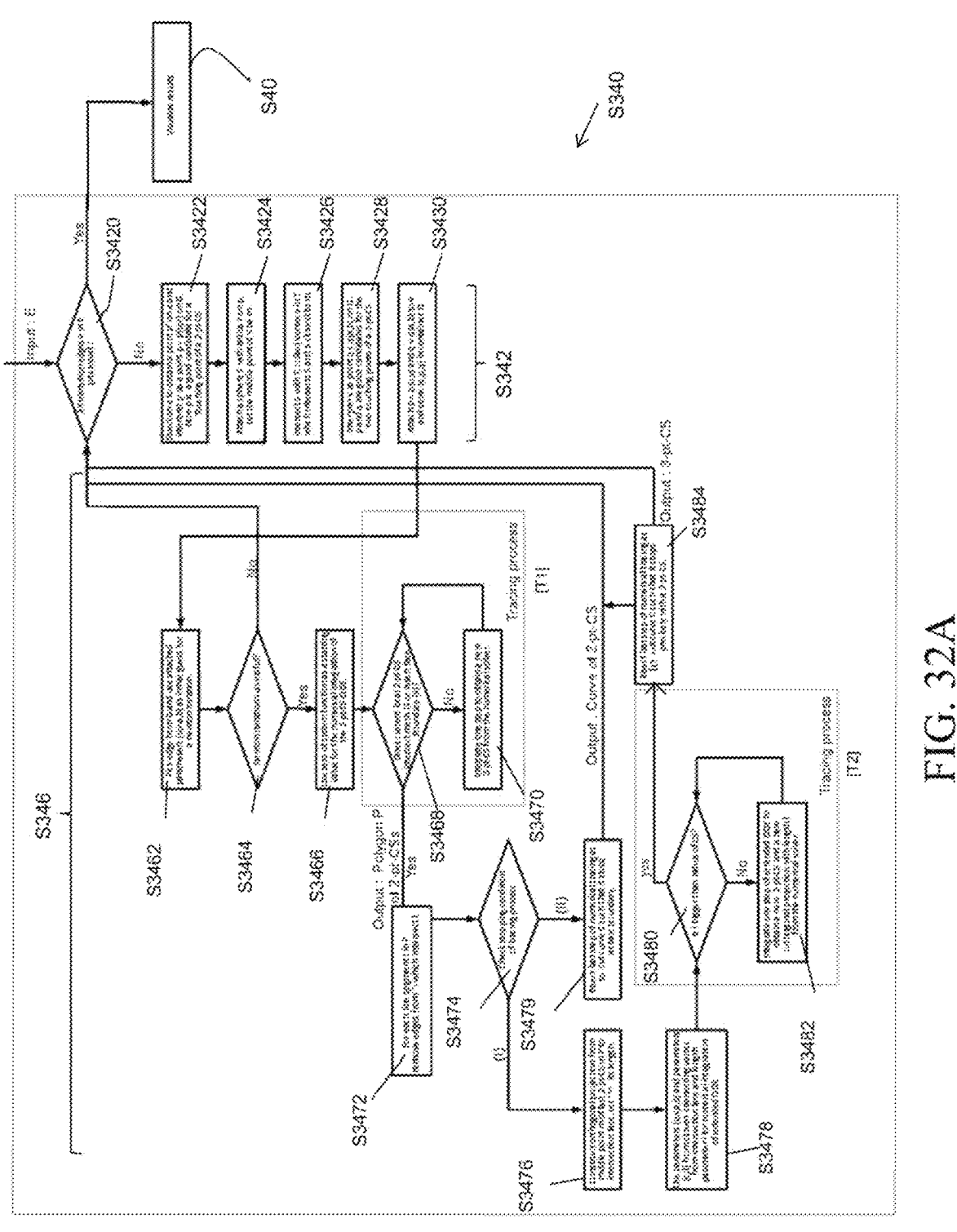
Figure 32B:
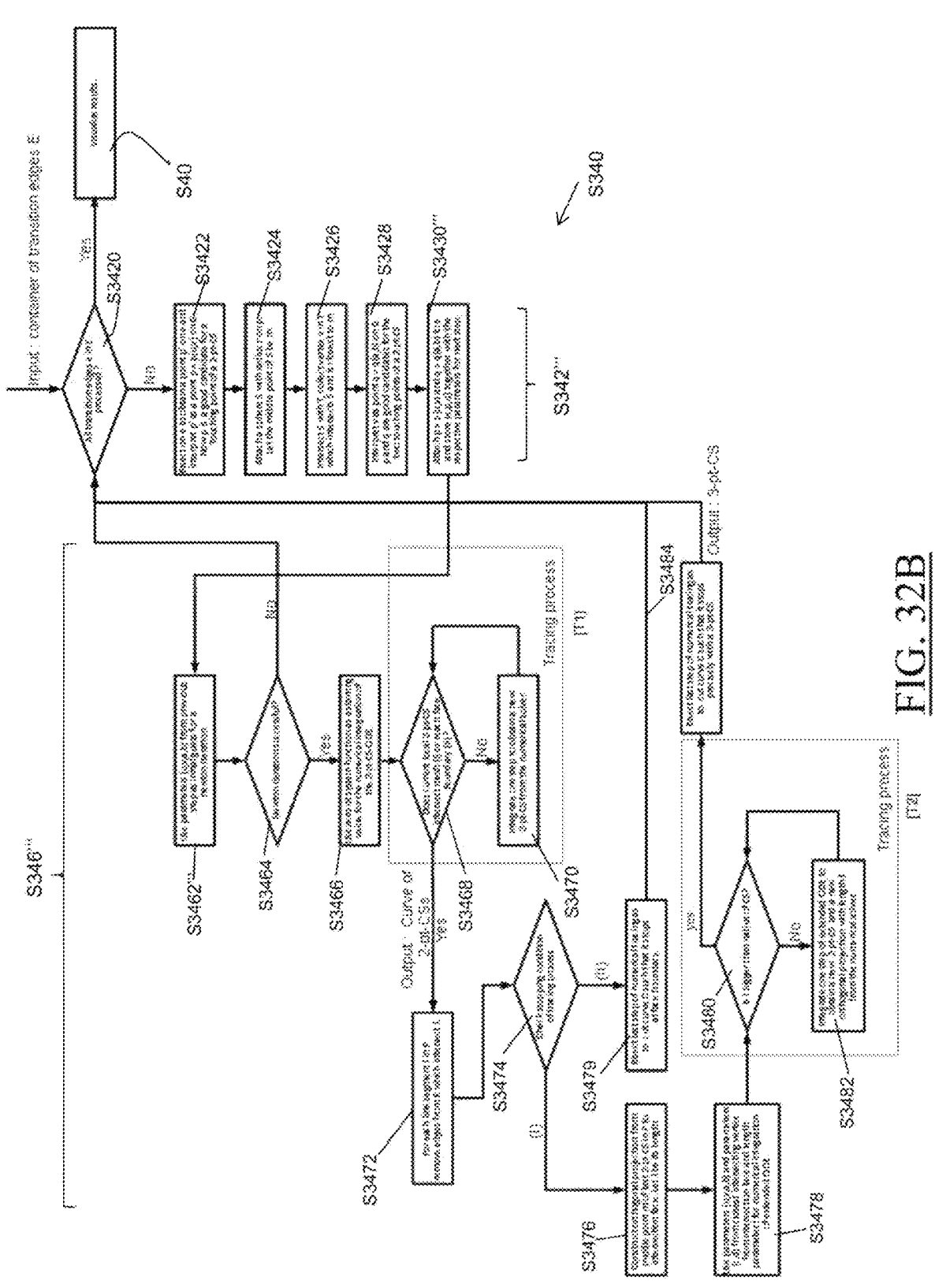

FIGS. 32A-B are now discussed.

FIG. 32A illustrates an implementation of the continuous HID as a whole. Afterwards, the discussion with reference to the next figures provides the respective system function, its related ODEs, some explanations on the bisection and specifications on the notational conventions.

FIG. 32A shows a flowchart of a Global Contact Sphere algorithm S340 followed by a displaying S40. The algorithm S340 may form part of the determining S30, and be executed after the determining S30 has executed the tessellating of the B-Rep and the processing of the tessellation, as mentioned above. The processing may have identified, for the radius value, one-point-contact vertices and non-contact vertices. And the processing may have defined transition edges, each transition edge being bounded by a respective one-point-contact vertex and a respective non-contact vertex.

The algorithm S340 may thus be inputted with an initial input E, which is a container of all transition edges obtained from the discrete HID algorithms.

The algorithm works in a loop and first tests S420 if all transition edges e in E have been processed. If the answer is Yes, the algorithm ends, and the method may display at S40, for user visualization, a graphical visualization of all two-point-contact curves previously traced by the algorithm and all three-point-contact points (at extremities of said curves) previously found by the algorithm. If the answer is No, the algorithm rather executes a normal iteration by executing S342.

S342 is a process S3422-3430 to establish a respective pair {p,q} of candidate starting (touching) points of the B-Rep based on each transition edge e of E.

At S3422, the algorithm performs a bisection on a remaining transition edge e to obtain a point p' on e, and interpret p' as a point p=p(u,v) on the B-Rep, noted G. Now, p is a good candidate for a touching point of a two-point contact sphere.

At S3424, the algorithm attaches a sphere S with radius R (provided earlier at S20) on p, and identifies the middle point (i.e. center) of S as point m. Sphere S is the contact sphere.

At S3426, the algorithm intersects S with the tessellation T of the B-Rep. The algorithm then collects the vertex v of T which intersects S (i.e., is included in the sphere) and is closest to m.

At S3428, the algorithm interprets v as a point q=q(a,b) on the B-Rep G. p and q are good candidates for the two touching points of a two-point-contact sphere.

At S3430, the algorithm attaches p=p(u,v) and q=q(a,b) to e, and stores the triplet (e,p,q) in a container D (initially empty).

This ends the current iteration of the process S342, and the algorithm then executes a two-point-contact-curve computing algorithm S346.

At S3462, the algorithm picks (i.e., selects) a transition edge (i.e., within a triplet) from D and uses the attached parameters (u,v,a,b) from the triplet as an initial guess, and runs a Newton iteration on the B-Rep based on this guess, that is, from the pair of candidate starting points p and q (as discussed earlier and further exemplified later). Here, the algorithm attempts to trace a two-point-contact curve based on the selected transition edge e, by attempting to find a respective initial point belonging to a two-point-contact curve from the respective pair of candidate starting points p and q.

At S3464, the algorithm tests if the finding attempt is successful. If this is the case, the algorithm goes to S3466 to start tracing the two-point-contact curve from the respective initial point which has been found by the Newton iteration. In such a case, thanks to the later steps of the algorithm, the algorithm robustly succeeds in tracing the two-point-contact curve. Otherwise, the algorithm returns to S3420 to retry with a new transition edge.

At S3466, the algorithm sets the zero found by the Newton iteration as an initial/starting value for a numerical integrating of a respective ordinary differential equation describing the behavior of the two-point-contact sphere (as discussed earlier and further exemplified later).

T1 is a tracing process corresponding to said numerical integration.

At S3468, T1 tests if the current local two-point-contact sphere intersects mesh, noted condition (I), or reach a face boundary, noted condition (II) (as discussed earlier and further exemplified later).

At S3470, if none of the conditions is evaluated to be fulfilled, the tracing T1 continues and integrates one step to obtain a new two-point-contact sphere from a numerical solver.

Otherwise, the successive numeric integration steps of the tracing T1 are stopped, and the algorithm outputs a polygon P in $\mathbb{R}^4$ consisting of (u,v,a,b) parameters, which can be considered as two polygons P_1, P_2 of touching curves in $\mathbb{R}^3$ (with vertices representing successive touching points of the successive contact spheres of each integration step), and the algorithm further goes to S3472 and to S3474 in parallel.

At S3472, the algorithm removes from E each transition edge intersected by a line segment of polygon P_1 or P_2. Each removed transition edge is not available anymore to the algorithm. In very rare cases, this may lead to a loss of information (for example, for a transition edge having two transitions on it, one of the transitions may be lost by S3472). Discrete models and the discretization may indeed sometimes be too rough to capture multiple components of the solution set. In such a case the user may simply use a finer discretization. In any case, that should occur very rarely when using typical examples and appropriate parameters.

In [this was misleading and simply a mistake in the flow chart. In the updated flow chart this step is done before the ones described in the following] S3474, the algorithm verifies which of condition (I) or (II) stopped the tracing process T1, and respectively goes to S3476 or S3479 depending on the condition.

If this is condition (I), the algorithm prepares for solving, with tracing process T2, another respective ordinary differential equation based on the B-Rep, said other equation describing the behavior of the three-point-contact sphere (as discussed earlier and further exemplified later).

For that, at S3476 the algorithm constructs the orthogonal projection of the middle point m of the last vertex of polygon P, corresponding to the last contact sphere of the integration T1, to the intersected face (i.e., third portion being intersected). The length of the orthogonal projection is noted I.

Then at S3478, the algorithm uses the parameters (u,v,a,b), already provided, parameters (c,d), taken from the closest intersecting vertex of the intersected face (as tessellated), and parameter I, for a numerical integration of this extended differential equation.

T2 is the tracing process corresponding to said numerical integration.

At S3480, T2 tests if the current value of I is bigger than the radius R of the contact sphere. If this is the case, T2 stops, otherwise the tracing continues, and at S3482, T2 integrates one step of the extended differential equation to obtain a new two-point-contact sphere and a new orthogonal projection of length I from a numerical solver.

T2 will eventually stop by the test S3480 being positive.

At S3484, the algorithm may bisect the last step of T2 so as to cut/truncate the curve being traced (noted C) such that it stops precisely with a three-point-contact sphere. This outputs both a three-point-contact sphere with respect to the surface pair supporting p and q (and another surface), and a two-point-contact curve with respect to the same surface pair, which ends up in the aforementioned three-point-contact-sphere.

If T1 rather stops with condition (II), then the method may go to S3479 and bisect the last step of T1 so as to cut/truncate the curve C such that it stops at the face boundary precisely. This outputs a two-point-contact curve with respect to the same surface pair.

In both cases, the algorithm returns to returns to S3420 to start again with a new transition edge.

FIG. 32B shows a variation of the flowchart of FIG. 32A, where the only difference is that at S342''', no container D is used, such that there is no storing therein at S3430''' and no picking therein at S3462'''.

Figure 33:
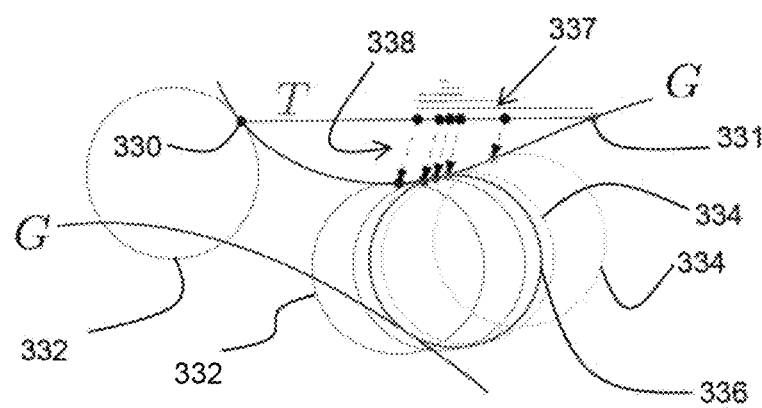

Referring to FIG. 33, the bisection performed at S3422 bisects on a transition edge T between an active vertex 330 and an inactive vertex 331. Each vertex of the tessellation is a point on the continuous B-Rep input geometry G. To interpret the points on the transition edge in-between vertices as points on the continuous geometry, the implementations of the method may linearly interpolate between the parameters attached to the vertices. FIG. 33 shows a bisection between intersecting spheres 332 (blue) and non-intersecting spheres 334 (green) which converges to a 2-point-contact sphere 336 (violet). Within this process the bisected points 337 on the transition edge are reinterpreted (see dashed vectors 338) as points on G via linearly interpolating parameters of the initial inactive vertex 331 (green) and the active vertex 330 (blue).

As the bisection uses an intersection algorithm which uses the approximated mesh geometry, the respective results may be not precise enough to provide a true zero of the system function. However, these results may most often be close enough to a zero, such that a newton iteration quickly converges to a true zero of F.

The Newton iteration is applied to the system function F: $\mathbb{R}^4 \to \mathbb{R}^3$:

$$F(u,v,a,b)=s_1(u,v)+R\ N_1(u,v)-[s_2(a,b)+R\ N_2(a,b)]$$

Here $s_1$, $s_2$ are the parametrizations of the considered pair of surface patches, $N_1$, $N_2$ are their normal maps, $(u,v)$, $(a,b)$ are the respective parameters and R is the radius of the contact spheres. This yields initial values $(u_0, v_0, a_0, b_0)$ for the following tracing process [T1].

The tracing process [T1] provides a numerical solution of the initial value problem associated to the following implicit ordinary differential equation, which follows directly from the implicit function theorem applied to the implicit equation $F(u(t), v(t), a(t), b(t))=0$:

$$DF(u(t),v(t),a(t),b(t))*(u'(t),v'(t),a'(t),b'(t))=0$$

Here DF is the differential (Jacobian) of F and the dashed variables represent the respective derivatives with respect to t. To make this explicit one may solve this linear equation system for $(u'(t),v'(t),a'(t),b'(t))$. The initial values are given by $(u(0), v(0), a(0), b(0))=(u_0,v_0,a_0,b_0)$.

Figure 34:
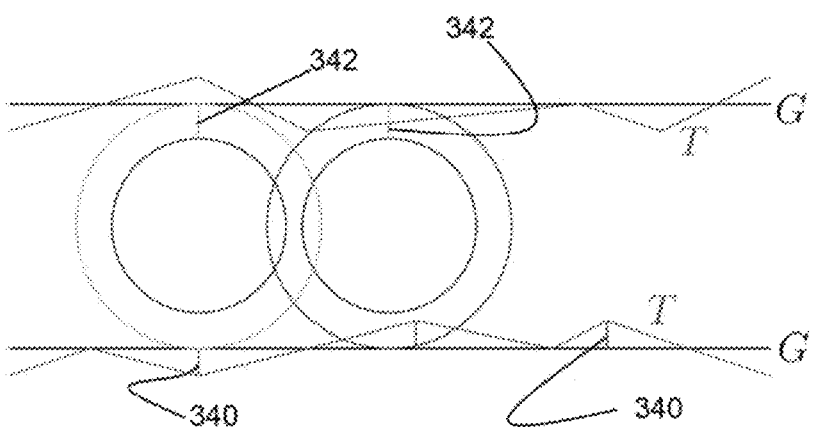

Referring to FIG. 34, in each step of [T1] the current 2-point-contact sphere (using a slightly smaller radius) is intersected with the rest of the complete discretized input geometry. In case there is an intersection [T1] stops with condition (I) and provides the respective intersection face/surface patch parametrization $s_3$. Otherwise [T1] stops with condition (II).

FIG. 34 illustrates the intersection problem which is solved in every step of the numerical integration [T1], which may be modified by using a sphere with the same middle point (center) and smaller radius. This is due to the fact, that the sphere is intersected against the discretized input geometry T, having a certain tolerance 340 (violet). Using the original radius would yield intersecting spheres with the two considered touching faces due to the discretization error. The radius is reduced by the mesh tolerance plus a small safety margin 342 (orange).

The tracing process [T2] numerically integrates an extended ODE resulting from the extended system function $F:\mathbb{R}^7 \to \mathbb{R}^6$:

$$F(u,v,a,b,c,d,l)=(s_1(u,v)+R\ N_1(u,v)-[s_2(a,b)+R\ N_2(a,b)],s_1(u,v)+R\ N_1(u,v)-[s_3(c,d)+l\ N_3(c,d)])$$

Here $s_3$, $N_3$ are the parametrization and the normal map associated to the face/surface patch which was intersected when [T1] stopped with (i). The respective ODE results analogously from the implicit function theorem. Its initial values $(u_1,v_1, a_1,b_1,c_1,d_1,l_1)$ are provided from the last step of [T1] yielding $(u_1,v_1,a_1,b_1)$, whereas the orthogonal projection (see box c) provides the parameters $(c_1,d_1)$ of the base point of the orthogonal projection and length of the orthogonal projection $l_1$.

Implementations of the inspection functionality for contact spheres are now discussed.

Figure 35:
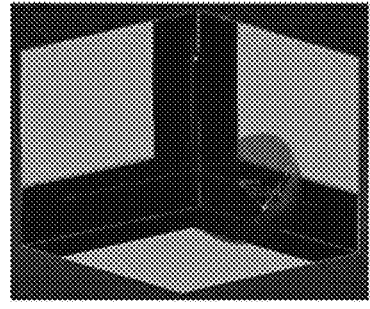
Figure 36:
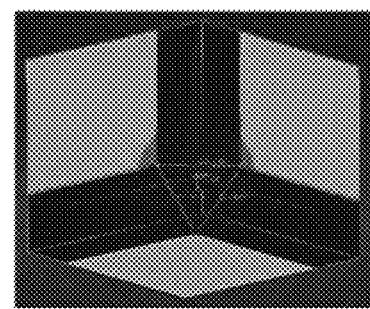

Referring to FIGS. 35-36, in order to inspect the two-, respectively, three-point-contact spheres within the enhanced ICEM Surf, one may firstly check boxes in a respective dialog box and then click either 2Pt-, respectively, 3Pt-Inspect-Buttons. Additional check boxes may control additional visualization (such as distance, points, lines, sphere). FIG. 35 and FIG. 36 show respective two- and three-point contact spheres.

Figures 37, 38, 39, 40, 41, 42, 43:
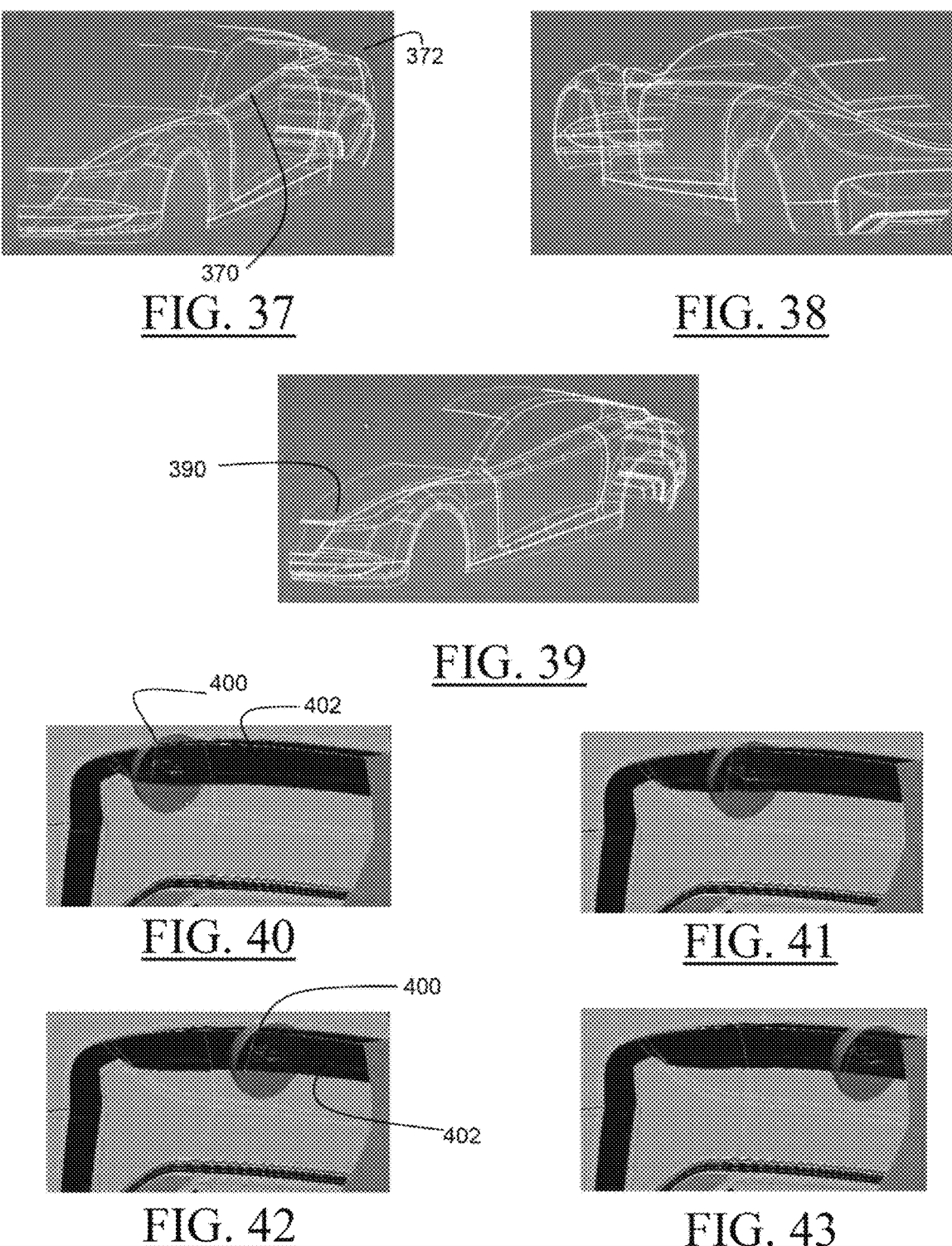

FIGS. 37-39 show the results of the contact sphere algorithm applied to the B-Rep of FIGS. 9-10 (i.e., a highly complex geometry), where each of the above described steps is applied hundreds of times to obtain a multitude of touching- and middle-curves which correspond to curves of two-point-contact spheres. As shown on FIG. 37 and FIG. 38, middle curves 372 are red, whereas touching curves 370 are yellow. FIG. 39 shows detected three-point-contact spheres 390.

FIGS. 40-43 show a series of two-point-inspects obtained by dragging the sphere 400 along its associated curve 402 of middle points (red). When one inspects a two-point-contact sphere, the depicted middle point of the respective contact sphere can be dragged along the respective middle curve with the mouse in real-time. The figures show a series of two-point-inspects obtained in that way. As mentioned earlier, this represents an actual process in time occurring in collisions with pedestrians, where the part of the human body, which is modeled as a sphere, is dragging along two-point-contact spheres to finally arrive in a configuration represented by a three-point-contact sphere.

Implementations of the second aspect of the method are now discussed with reference to FIGS. 44-50.

The computations which underlie the head impact diagnosis, mainly the contact sphere algorithm, are quite complex and the computation speed-up due to parallelizing the algorithm improves the control process of safety specifications as it simply saves a lot of time. This is especially due to the fact, that typically a problem detected by the head impact diagnosis forces a small redesign, which in turn forces a re-computation of the head impact diagnosis, such that the advantage of a faster computation impacts the safety compliance process multiple times.

The average time required to perform a complete HID for a complex input geometry as shown in FIGS. 9-10 is high and delays the design process of vehicles significantly, especially since this process often has to be carried out multiple times, often in cycles which consist of a small design change as to address a problem detected by a previous HID followed by a new computation of the HID. Typically the HID computation, especially if it has to be done with high accuracy, is performed overnight. In case just one parameter has been entered incorrectly or some other problem occurs, the correction process is significantly delayed. Furthermore each other design change, for example for engineering purposes, may often involve a re-check of the safety analysis. Thereby the design process as a whole profits tremendously from a speed-up of the multiple HIDs involved.

Implementations of the method now discussed tackle this issue.

Firstly, the continuous HID uses the results of the discrete HID for approximating starting values for the tracing processes performed during the continuous HID. Therefore a speed-up of the discrete HID also improves the continuous HIDs performance in case only the latter is used.

So as to speed up the computation of the discrete and continuous HID algorithm, the implementations of the method follow the approach of parallelizing the algorithm over its input surface patches for the discrete version, whereas the continuous HID allows for a parallelization over pairs of surface patches. As a typical geometric model of for example a vehicle, consists of hundreds, or more likely, thousands of surface patches (or more generally faces) this will improve the performance of the algorithms (in contrast to their sequential versions) by the factor of parallel threads the used CPU is capable of.

Challenges faced for the parallelization of the HID algorithm are firstly to make the decoupling steps of the algorithm thread safe. Secondly, and more complex, is the redesign of the top-level control flow of the discrete and continuous HIDs and realize a reasonable synchronization of the different steps with respect to the work load of the respective tasks.

Doing some operations in parallel has an enormous effect in the overall runtime of the HID. Since the tasks can do their computation independently, the algorithm provides a good scaling with respect to the hardware (i.e. the number of CPUs and their parallel thread capability).

As now discussed, the implementations of the method thus comprise parallelizing the discrete HID.

In order to allow for a parallelization, one may check which steps of the algorithm can be decoupled. The minimal number of steps to be synchronized is now determined by the times in the sequential flow of the to be parallelized algorithm where the next step requires the whole result of the previous step.

Figure 44:
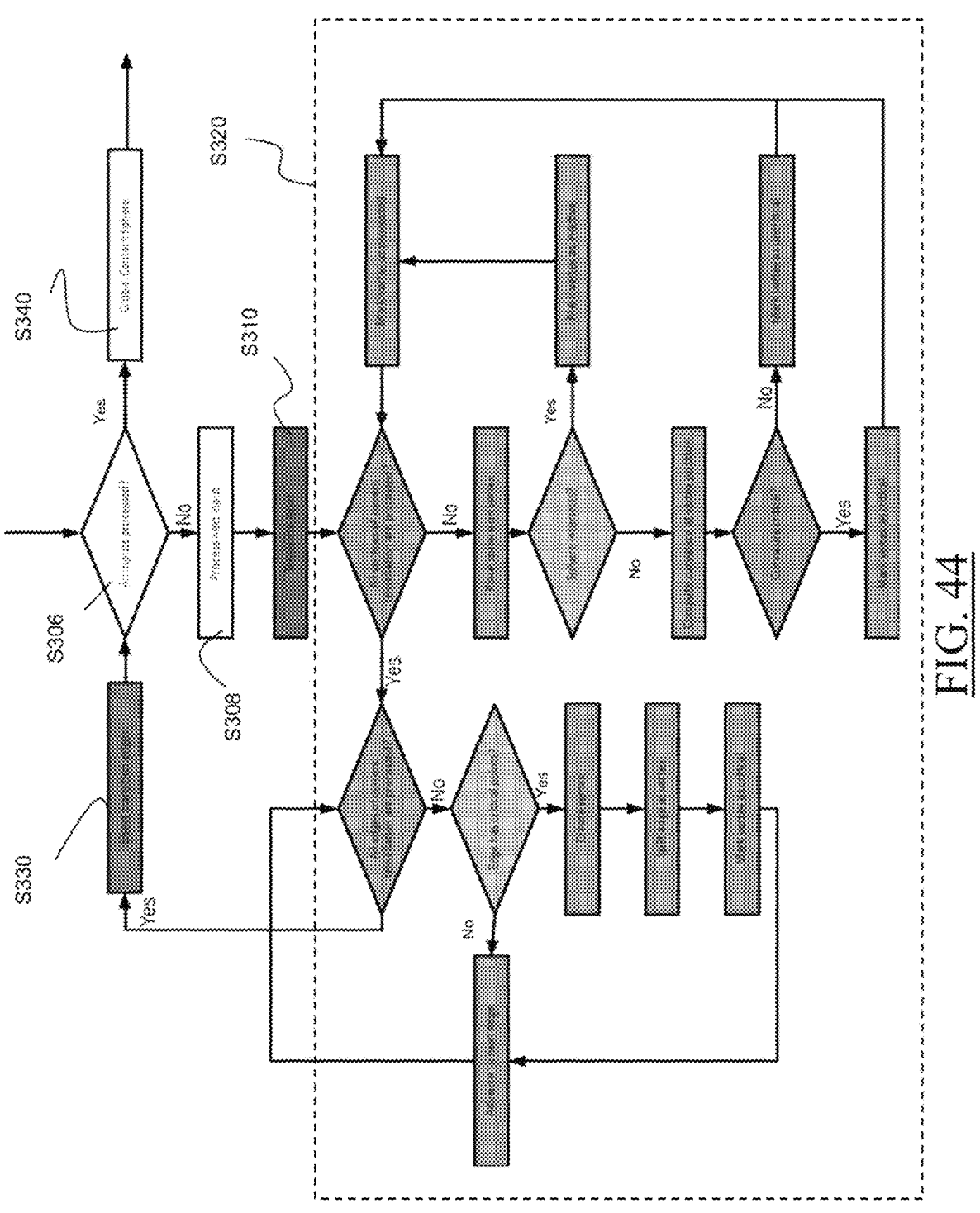

Referring to FIG. 44 which shows a flow diagram of the discrete HID, following this approach the discrete HID may be divided into three essential steps:

Pre-process S310: tessellation of the input surfaces (i.e., the faces of the B-Rep).

Main computation S320: Intersection computations of one-point-contact spheres with the whole input geometry. This yields the so-called transition edges, each of the latter having one active and one inactive vertex. In this step, a special treatment of the "Sphere intersects" and "Edge has critical points" may be executed so as to guarantee thread-safety.

Post-process S330: Bisect the transition edges so as to smoothen the transition from active to inactive regions and lessen the error impact imposed by the initial approximation of the input geometry via a tessellation.

First of all, all three steps may be implemented in a thread safe way, using for example mutex-locks, or more generally semaphores, so as to ensure a safe read/write access of the different threads on common input data. Now each of these steps can be decoupled over surface patches and parallelized respectively. The flowchart depicted in FIG. 44 also reflects the complexity distribution of the discrete HID algorithm. Step S310 (input tessellation) and step S330 (bisection of the transition edges) are comparably straightforward. Step 320 contains the essential logic to yield active and inactive vertices. So as to find more transition edges, step 320 splits edges under certain criteria (mainly if they are too long) and introduces thereby a modification of the underlying mesh.

In all three steps, inputs are split surface wise, i.e. in each step each thread handles one surface patch respective to a face of the input B-Reps. This achieves a good balancing, such that the workload is distributed adequately over threads and synchronizing the results in-between the three steps can be done without unreasonable waiting times.

Precise reasons for a break-up of the discrete HID into three steps are the following. Step 320 may access to the whole tessellation computed in step 310 so as to intersect spheres against the whole approximated input geometry. Step 330 at a first glance could be parallelized together with step 320. However, step 320 may modify the mesh so as to ensure higher accuracy in the critical regions and the resulting finer mesh may rather be considered in step 330 as a whole, for improved accuracy.

Figure 45:
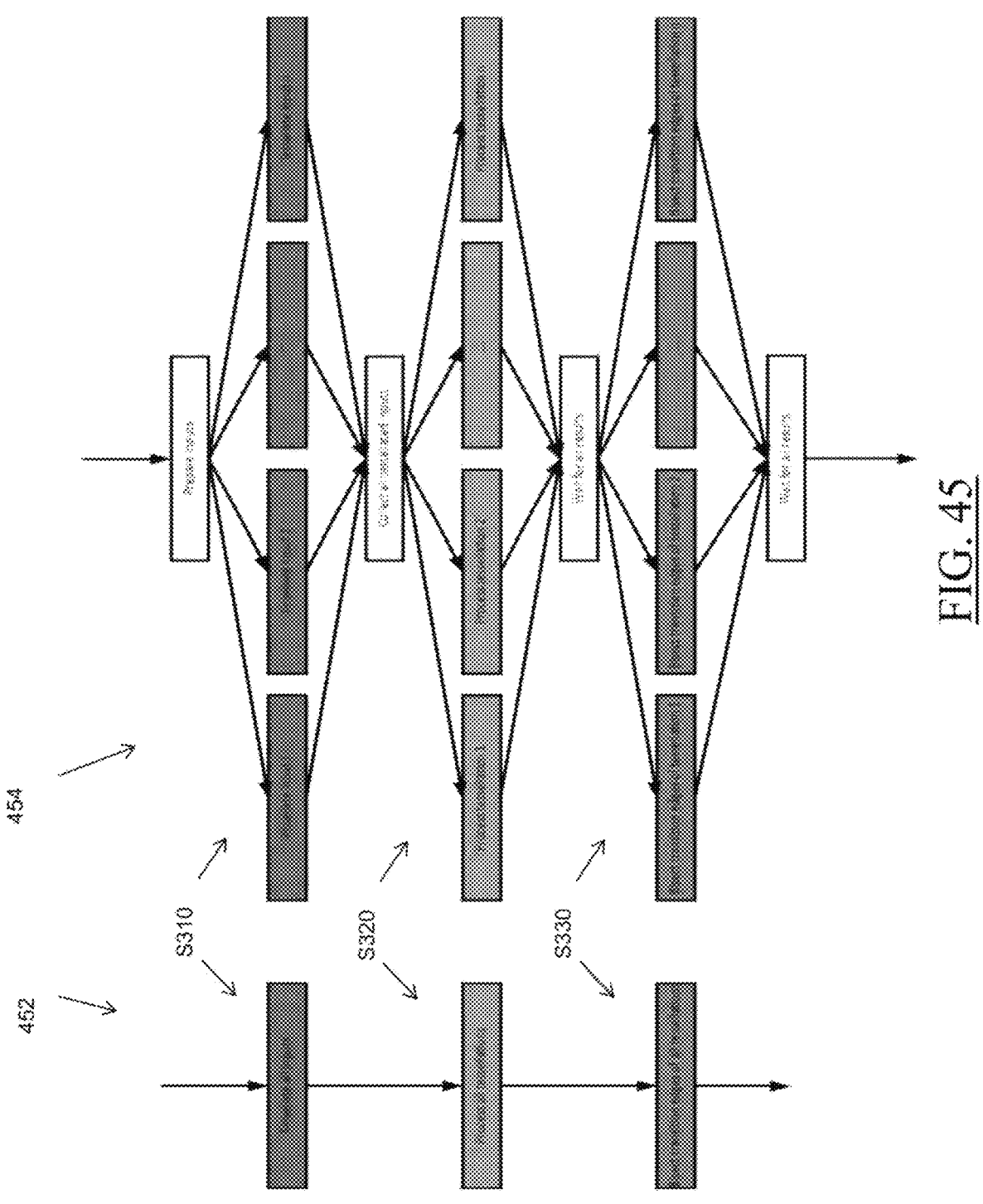

FIG. 45 depicts a top-level control flow of the parallelization approach for the discrete HID. The figure compares the sequential flowchart 452 versus the parallel flowchart 454 of the discrete HID. In line with the above, the implementations of the method may wait for the end of all threads of each phase, before proceeding to the next phase.

Figure 46:
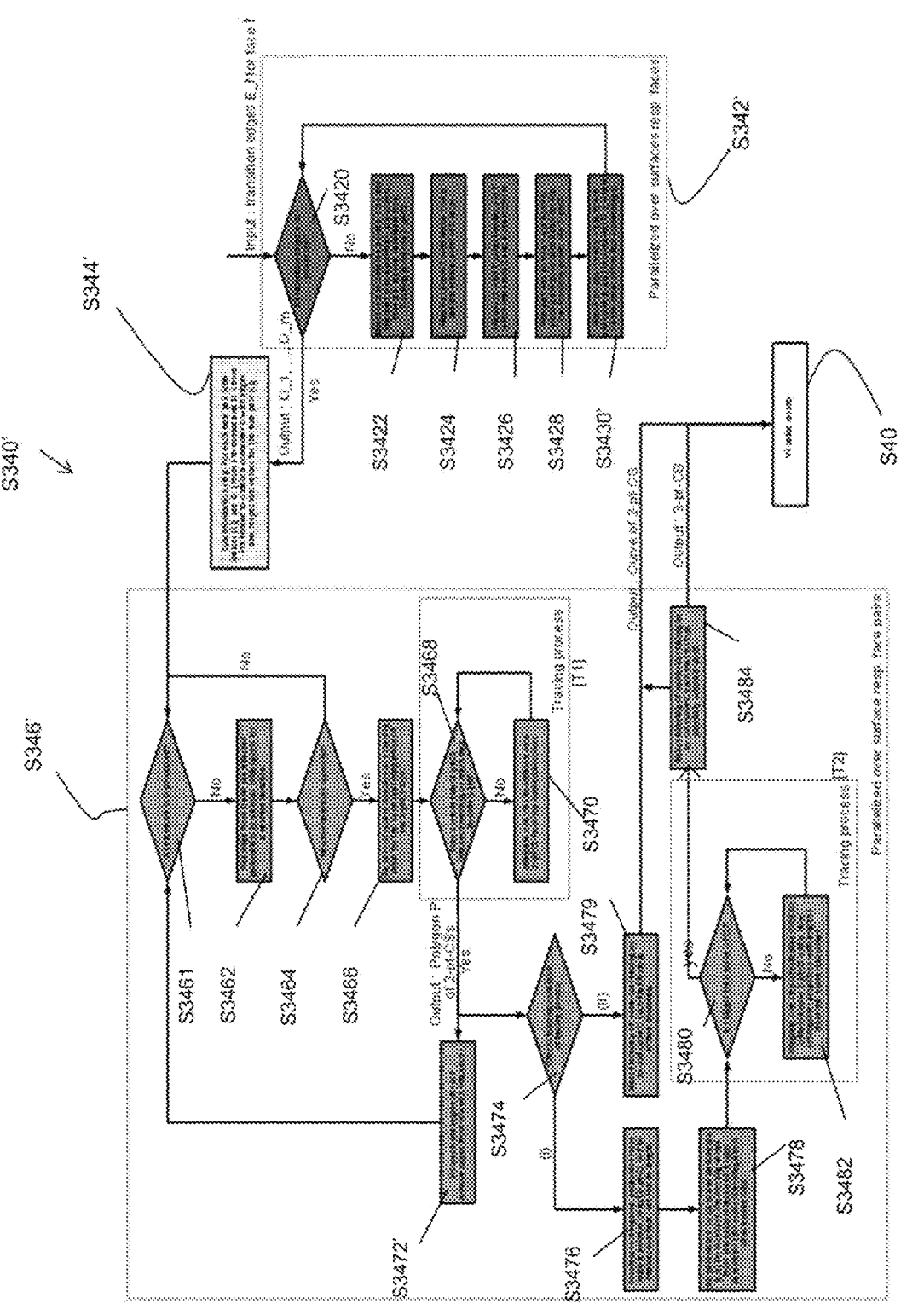
Figure 47:
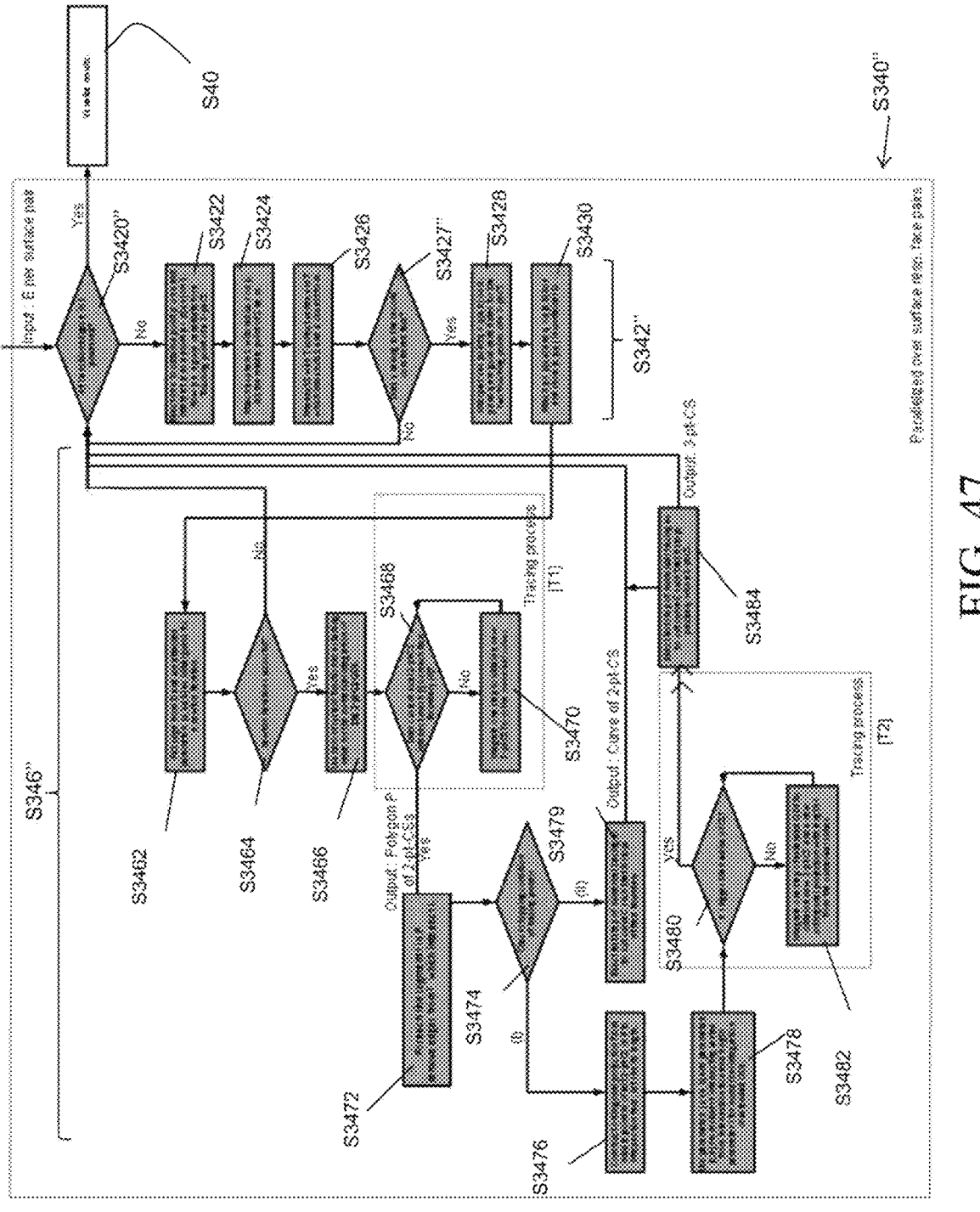

With reference to FIGS. 46-47, the implementations of the method may further comprise parallelizing the continuous HID. In other words, the determining S30 includes, for each respective pair of faces of the B-Rep, a respective two-point-contact-curve computing algorithm based on the respective pair of faces, the computing algorithm being parallelized over the plurality of pairs of faces (computing algorithm S346' on FIG. 46, computing algorithm S346" on FIG. 47).

FIG. 46 shows a control flow of the global contact sphere algorithm S340' followed by a displaying S40. The control flow is based on the control flow of FIG. 32A. The algorithm FIG. 46 differs from the algorithm of FIG. 32A according to the following.

The input is again a set of transition edges E. So as to parallelize the global contact sphere algorithm which underlies the continuous HID, in a first step, the control flow of the algorithm is grouped into two essential parallelization components.

The first component S342' consists of the transition edge extraction. As apparent from the numeric references on the figure, it is identical to process S342 of FIG. 32A, except for a few differences. Essentially, S342' is parallelized over the set of surface patches/faces of the B-Rep. Thus, the input is a container E of per-face transition edges (also noted "E_k" for a face of index k). In addition, S342' comprises returning from S3430 to S3420 before directing the algorithm toward the computing algorithm S346', and this until all transition edges of the face have been processed. As a result, unlike S342, S342' populates a container D containing triplets (e,p,q) relatively extensively. Furthermore, S342' organizes D for the next steps of the algorithm. In specific, at S3430', the algorithm attaches p=p(u,v) and q=q(a,b) to e, and stores the triplet (e,p,q) in a container D_i (initially empty), where i is the index of the face containing q.

The second component S346' constitutes the main part of the algorithm, that is, the two-point-contact-curve computing algorithm. As apparent from the numeric references on the figure, it is identical to process S346 of FIG. 32A, except for a few differences. Essentially S346" is parallelized over the set of pairs of surface patches/faces of the B-Rep. This is the maximal decoupling of the computation of two-point-contact spheres as the numeric integration of the ODE for local contact spheres couples two surface patches (which contain the respective touching curves). Again each component of the algorithm may be thread safe with respect to common data used of the individual tasks.

The output of S342' is a container D with a set of pairs of starting values where the second starting value is not restricted to a certain face. Thereby between the two parallelized boxes (the first being parallelized over faces and the second being parallelized over face pairs) there is a synchronization step S344', where all the results E_1, . . . , E_n (n being the number of faces) are processed to obtain containers D_1, . . . , D_m (m being at max the number of face pairs, i.e. $m<=n*(n-1)/2$). However, not each face pair has to contribute starting values here, thereby m is typically smaller than n. For this reason, S342' is an attempt (not sure to succeed for each pair of faces) to establish one or more candidate starting point belonging to a respective face.

In specific, at S344', for each face pair with indices i,j, the algorithm uses D_j from the i-th thread of S342' and D_i from the j-th thread to obtain the container D with edges and respective values for the face pair {i,j}, said container D being inputted to each parallel thread of S346'.

Referring to FIG. 47, the establishing attempt S342" may be parallelized over the plurality of pairs of faces, together with the computing algorithm S346".

The linear structure of firstly computing initial values from all transition edges and secondly processing them so as to trace the resulting curves of two-point-contact spheres may be put together so as to allow for another optimization. The latter is achieved by providing each task only the transition edges that lie on the two respective surfaces considered in this task. FIG. 47 shows the modified control flow S340" of the global contact sphere algorithm in line with this, in other words, a flowchart of a parallelized version of the global contact sphere operator underlying the continuous HID. All components are already thread safe and the decoupling over surface patches has been tested successfully.

The algorithm FIG. 47 differs from the algorithm of FIG. 46 according to the following.

S342" is not parallelized over the set of faces of the B-Rep, but it is parallelized over the set of pairs of faces of the B-Rep. Thus, the input of S342" is the set of all transition edges of the respective face pair of each thread. S342" further comprises an additional step S3427" testing if the vertex v found at S3426 belongs to the second face of the respective pair of the thread (i.e., the other face than the input edge e and resulting point p). If the test is negative, the algorithm stops with edge e and tries with the next edge of E, since otherwise it would be considering a pair of candidate points with one point outside the respective face pair of the thread. Thus, the synchronization step S344' is removed, and the interaction between S342" and the computing algorithm S346" reverts to being identical to the interaction between S342 and S346 of FIG. 32A.

Figures 48, 49, 50:
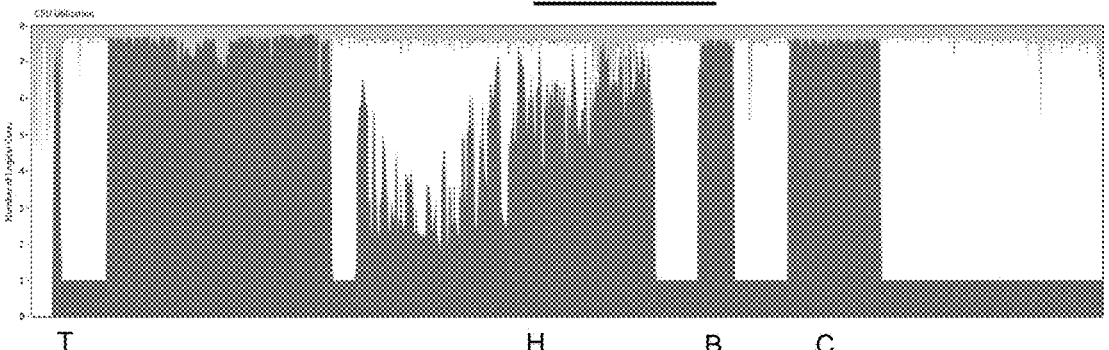

FIG. 48 shows a table illustrating the impact of the parallelization of the discrete HID on the speed-up of the complete HID-algorithm (consisting of the discrete and continuous HID). The measurements were done on a Dell Precision S820 Tower with an Intel Xeon W-2123 CPU, running on 3.6 GHz (4 Cores+Hyper Threading) and 64 GB Ram. The operating system running on that Workstation is Windows 10 Enterprise 1809. The number of vertices and triangles produced by the respective tessellations on different example B-Reps are provided in the table (example 1 being the B-Rep of FIGS. 9-10). Only an implementation was tested which uses the parallel version of the discrete HID. Nevertheless, this should be sufficient to get an idea of the performance boost. It is expected at least another average factor of 2 when the final parallelization of the complete HID algorithm is reached.

FIG. 49 shows a table illustrating workload percentages of the three steps of the discrete HID applied to three of the examples of FIG. 48. The work load of the threads was measured with Visual Studio Concurrency Profiler. As the parallelization was split into several parallel tasks, a distribution for such tasks is shown below. "T" is the tessellation task, "H" the regular Head Impact task, "B" is the edge bisection task and "C" is the global contact sphere task.

As shown in the table, the workload heavily depends on the used example. The synchronization at this point is not optimal for some examples especially for the Head Impact task ("H"). This is due to the usage of some non thread-safe routines in the core library which may easily be addressed.

FIG. 50 shows the CPU utilization diagram for the B-Rep of FIGS. 9-10. This gives another hint at to the workload of the specific tasks.

The invention claimed is:

1. A computer-implemented method for vehicle impact analysis in computer aided design (CAD), the method being included in a manufacturing process, the method comprising:

obtaining, for a 3D modeled object, a B-Rep representing an outer surface of a vehicle, the B-Rep having faces;

obtaining a radius value for a contact sphere;

determining, on one or more processors including at least one massively parallel processor (MPP) or GPU implementing the computer aided design via a CAD program, one or more two-point-contact curves of the 3D modeled object for the radius value for performing the vehicle impact analysis in CAD;

applying the vehicle impact analysis using the determined one or more two-point-contact curves of the 3D modeled object for the radius value by executing an impact simulation based on the one or more two-point-contact curves, the impact simulation calculating where a 3D modeled version of the outer surface the vehicle would contact a 3D modeled version of an object in case of a collision between the 3D modeled version of the outer surface of the vehicle and the 3D modeled version of the object, the object including a person who is contacted by the outer surface of the vehicle in the case of the collision between the outer surface of the vehicle and the person;

assessing whether the vehicle meets safety standards based on damage to the object and whether the damage is within a predetermined threshold corresponding to the safety standards; and improving safety of the vehicle by modifying a design of the vehicle based on obtained results of the vehicle impact analysis such that the damage to the object is within the predetermined threshold corresponding to the safety standards, where the modification of the design of the vehicle uses the determined one or more two-point-contact curves of the 3D modeled object to apply the vehicle impact analysis in the execution of the impact simulation, wherein the determining further includes:

tessellating the B-Rep, displaying a graphical representation of the outer surface of the vehicle, the graphical representation being a tessellation of the B-Rep, displaying the contact sphere with the radius value, the contact sphere contacting the graphical representation of the outer surface, moving the sphere along the graphical representation of the outer surface, for each respective pair of portions of a plurality of pairs of portions of the B-Rep, applying a respective two-point-contact-curve computing algorithm based on the respective pair of portions, the computing algorithm being parallelized over the plurality of pairs of portions by launching multiple parallel threads of the same computing algorithm on the one or more processors including the at least one massively parallel processor (MPP) or GPU, each parallel thread taking as input a respective pair of portions of the plurality of pairs of portions, wherein the determining further includes:

processing the tessellation, the processing including:

identifying, for the radius value, one-point-contact vertices and non-contact vertices, defining transition edges, each transition edge being bounded by a respective one-point-contact vertex and a respective non-contact vertex, and taking as input, using the computing algorithm and for each respective pair of portions, a respective set of transition edges of the respective pair of portions, and wherein for each respective pair of portions, the computing algorithm includes, iteratively and until the respective set of transition edges is empty:

selecting a transition edge from the respective set of transition edges;

attempting to trace of a two-point-contact curve based on the selected transition edge;

if the tracing attempt is successful, deleting, from the respective set of transition edges, all transition edges intersecting the traced two-point-contact curve; and deleting, from the respective set of transition edges, the selected transition edge, and wherein the modified design of the vehicle is used in manufacturing the vehicle, the vehicle having vehicle impact analysis results in which the damage to the object is within the predetermined threshold.

2. The method of claim 1, wherein each portion of each pair of portions among the plurality of pairs of portions is a respective face of the B-Rep.

3. The method of claim 1, wherein the tessellating is parallelized over the set of portions and the processing and the taking as input using computing algorithm are performed after the tessellating has ended.

4. The method of claim 1, wherein the processing is parallelized over the set of portions and the taking as input using the computing algorithm is performed after the processing has ended.

5. The method of claim 1, wherein each face of the B-Rep is supported by a respective surface parameterization, the tracing including integrating a respective differential equation, the differential equation being based on a pair of surface parameterizations of the respective pair of portions.

6. The method of claim 1, wherein the determining further comprises, by the one or more processors:

attempting to establish one or more pairs of candidate starting points, each candidate starting point belonging to a respective portion of the respective pair of portions, each pair of candidate starting points being attempted to be established based on a respective transition edge of the respective pair of portions, and wherein if the establishing attempt is successful, in the computing algorithm:

the selected transition edge is a respective transition edge based on which the determining is successful in establishing a respective pair of candidate starting points; and the tracing attempt comprises:

attempting to find a respective initial point belonging to the two-point-contact curve from the respective pair of candidate starting points; and if the finding attempt is successful, tracing the two-point-contact curve from the respective initial point.

7. The method of claim 6, wherein the establishing attempt includes bisecting, by the one or more processors, each respective transition edge of the respective pair of portions.

8. The method of claim 6, wherein the establishing attempt is parallelized over the plurality of pairs of portions or over the set of portions by the one or more processors.

9. A non-transitory computer-readable storage medium having recorded thereon a computer program, the computer program comprising instructions for performing a method for vehicle impact analysis in computer aided design (CAD), the method being included in a manufacturing process, the method comprising:

obtaining, for a 3D modeled object, a B-Rep representing an outer surface of a vehicle, the B-Rep having faces;

obtaining a radius value for a contact sphere;

determining, on one or more processors including at least one massively parallel processor (MPP) or GPU implementing the computer aided design via a CAD program, one or more two-point-contact curves of the 3D modeled object for the radius value for performing the vehicle impact analysis in CAD;

applying the vehicle impact analysis using the determined one or more two-point-contact curves of the 3D modeled object for the radius value by executing an impact simulation based on the one or more two-point-contact curves, the impact simulation calculating where a 3D modeled version of the outer surface the vehicle would contact a 3D modeled version of an object in case of a collision between the 3D modeled version of the outer surface of the vehicle and the 3D modeled version of the object, the object including a person who is contacted by the outer surface of the vehicle in the case of the collision between the outer surface of the vehicle and the person;

assessing whether the vehicle meets safety standards based on damage to the object and whether the damage is within a predetermined threshold corresponding to the safety standards; and improving safety of the vehicle by modifying a design of the vehicle based on obtained results of the vehicle impact analysis such that the damage to the object is within the predetermined threshold corresponding to the safety standards, where the modification of the design of the vehicle uses the determined one or more two-point-contact curves of the 3D modeled object to apply the vehicle impact analysis in the execution of the impact simulation, wherein the determining further includes:

tessellating the B-Rep, displaying a graphical representation of the outer surface of the vehicle, the graphical representation being a tessellation of the B-Rep, displaying the contact sphere with the radius value, the contact sphere contacting the graphical representation of the outer surface, moving the sphere along the graphical representation of the outer surface, for each respective pair of portions of a plurality of pairs of portions of the B-Rep, applying a respective two-point-contact-curve computing algorithm based on the respective pair of portions, the computing algorithm being parallelized over the plurality of pairs of portions by launching multiple parallel threads of the same computing algorithm on the one or more processors including the at least one massively parallel processor (MPP) or GPU, each parallel thread taking as input a respective pair of portions of the plurality of pairs of portions, wherein the determining further includes:

processing the tessellation, the processing including:

identifying, for the radius value, one-point-contact vertices and non-contact vertices, defining transition edges, each transition edge being bounded by a respective one-point-contact vertex and a respective non-contact vertex, and taking as input, using the computing algorithm and for each respective pair of portions, a respective set of transition edges of the respective pair of portions, and wherein for each respective pair of portions, the computing algorithm includes, iteratively and until the respective set of transition edges is empty:

selecting a transition edge from the respective set of transition edges;

attempting to trace of a two-point-contact curve based on the selected transition edge;

if the tracing attempt is successful, deleting, from the respective set of transition edges, all transition edges intersecting the traced two-point-contact curve; and deleting, from the respective set of transition edges, the selected transition edge, and wherein the modified design of the vehicle is used in manufacturing the vehicle, the vehicle having vehicle impact analysis results in which the damage to the object is within the predetermined threshold.

10. The non-transitory computer-readable storage medium of claim 9, wherein each portion of each pair of portions among the plurality of pairs of portions is a respective face of the B-Rep.

11. The non-transitory computer-readable storage medium of claim 9, wherein the tessellating is parallelized over the set of portions and the processing and the taking as input using the computing algorithm are performed after the tessellating has ended.

12. The non-transitory computer-readable storage medium of claim 9, wherein the processing is parallelized over the set of portions and the taking as input using computing algorithm is performed after the processing has ended.

13. A system comprising:

a processor coupled with a memory, the memory having recorded thereon a computer program, the computer program comprising instructions for vehicle impact analysis in computer aided design (CAD) in a manufacturing process that when executed by the processor causes the processor to be configured to:

obtain, for a 3D modeled object, a B-Rep representing an outer surface of a vehicle, the B-Rep having faces, obtain a radius value for a contact sphere, and determine, on one or more processors including at least one massively parallel processor (MPP) or GPU implementing the computer aided design via a CAD program, one or more two-point-contact curves of the 3D modeled object for the radius value for performing the vehicle impact analysis in CAD, apply the vehicle impact analysis using the determined one or more two-point-contact curves of the 3D modeled object for the radius value by executing an impact simulation based on the one or more two-point-contact curves, the impact simulation calculating where a 3D modeled version of the outer surface the vehicle would contact a 3D modeled version of an object in case of a collision between the 3D modeled version of the outer surface of the vehicle and the 3D modeled version of the object, the object including a person who is contacted by the outer surface of the vehicle in the case of the collision between the outer surface of the vehicle and the person;

assess whether the vehicle meets safety standards based on damage to the object and whether the damage is within a predetermined threshold corresponding to the safety standards; and improve safety of the vehicle by modifying a design of the vehicle based on obtained results of the vehicle impact analysis such that the damage to the object is within the predetermined threshold corresponding to the safety standards, where the modification of the design of the vehicle uses the determined one or more two-point-contact curves of the 3D modeled object to apply the vehicle impact analysis in the execution of the impact simulation, wherein the determination further includes the processor being configured to:

tessellate the B-Rep, display a graphical representation of the outer surface of the vehicle, the graphical representation being a tessellation of the B-Rep, display the contact sphere with the radius value, the contact sphere contacting the graphical representation of the outer surface, move the sphere along the graphical representation of the outer surface, for each respective pair of portions of a plurality of pairs of portions of the B-Rep, application of a respective two-point-contact-curve computing algorithm based on the respective pair of portions, the computing algorithm being parallelized over the plurality of pairs of portions by launching multiple parallel threads of the same computing algorithm on the one or more processors including the at least one massively parallel processor (MPP) or GPU, each parallel thread taking as input a respective pair of portions of the plurality of pairs of portions, wherein the processor is configured to determine by being further configured to:

process the tessellation by the processor being further configured to:

identify, for the radius value, one-point-contact vertices and non-contact vertices, define transition edges, each transition edge being bounded by a respective one-point-contact vertex and a respective non-contact vertex, and take as input, using the computing algorithm and for each respective pair of portions, a respective set of transition edges of the respective pair of portions, and wherein for each respective pair of portions, the computing algorithm includes, iteratively and until the respective set of transition edges is empty:

selecting a transition edge from the respective set of transition edges;

attempting to trace of a two-point-contact curve based on the selected transition edge;

if the tracing attempt is successful, deleting, from the respective set of transition edges, all transition edges intersecting the traced two-point-contact curve; and deleting, from the respective set of transition edges, the selected transition edge, and p1 wherein the modified design of the vehicle is used in manufacturing the vehicle, the vehicle having vehicle impact analysis results in which the damage to the object is within the predetermined threshold.

14. The system of claim 13, wherein each portion of each pair of portions among the plurality of pairs of portions is a respective face of the B-Rep.

15. The system of claim 13, wherein the tessellating is parallelized over the set of portions and the processing and the taking as input using the computing algorithm are performed after the tessellate has ended.

16. The system of claim 13, wherein the processing is parallelized over the set of portions and taking as input using the computing algorithm is performed after the process has ended.

17. The method of claim 1, wherein the vehicle impact analysis is head impact diagnosis.

18. The method of claim 1, wherein moving the sphere along the graphical representation of the outer surface comprises receiving a user input for sliding the sphere along the graphical representation of the outer surface such as dragging the sphere.

19. The method of claim 1, wherein user input includes receiving a movement from a haptic device.

* * * * *